United States Patent
Jin

(10) Patent No.: US 10,312,968 B2
(45) Date of Patent: Jun. 4, 2019

(54) HYBRID FIBRE COAXIAL FAULT CLASSIFICATION IN CABLE NETWORK ENVIRONMENTS

(71) Applicant: CISCO TECHNOLOGY, INC., San Jose, CA (US)

(72) Inventor: Hang Jin, Plano, TX (US)

(73) Assignee: Cisco Technology, Inc., San Jose, CA (US)

( * ) Notice: Subject to any disclaimer, the term of this patent is extended or adjusted under 35 U.S.C. 154(b) by 165 days.

(21) Appl. No.: 15/397,603

(22) Filed: Jan. 3, 2017

(65) Prior Publication Data

US 2017/0310541 A1    Oct. 26, 2017

Related U.S. Application Data

(60) Provisional application No. 62/327,159, filed on Apr. 25, 2016.

(51) Int. Cl.
*H04L 12/24*    (2006.01)
*H04L 12/26*    (2006.01)
(Continued)

(52) U.S. Cl.
CPC ............ *H04B 3/46* (2013.01); *G01R 31/3181* (2013.01); *G01R 31/31937* (2013.01);
(Continued)

(58) Field of Classification Search
CPC .......... G01R 31/3181; G01R 31/31937; H04B 3/142; H04B 3/46; H04B 3/493;
(Continued)

(56) References Cited

U.S. PATENT DOCUMENTS 7,706,252 B2    4/2010    Catter et al.
7,895,632 B2    2/2011    Sadja et al.
(Continued)

OTHER PUBLICATIONS

U.S. Appl. No. 15/372,259, filed Dec. 7, 2016, entitled "Network Architecture for Predictive Services Management in Cable Network Environments," Inventor: Hang Jin.
(Continued)

*Primary Examiner* — Alpus Hsu
(74) *Attorney, Agent, or Firm* — Merchant & Gould P.C.

(57) ABSTRACT

One embodiment is a system including a data collector located in a cable network for capturing multi-tone signals traversing the cable network; a data repository located in a cloud network and having an interface for communicating with the data collector and for storing the multi-tone signals captured by the data collector and network data associated with the cable network; and a central server including a memory element storing Predictive Services Management (PSM) algorithms comprising instructions and associated data and a processor operable to execute the PSM algorithms. The central server is configured for detecting a fault in the cable network and identifying a segment associated with the fault; determining a maximum tap magnitude for the fault; calculating an aggregate tap magnitude for the fault; and classifying a severity of the fault based at least in part on the maximum tap magnitude and the aggregate tap magnitude.

15 Claims, 27 Drawing Sheets

(51) Int. Cl.
| | |
|---|---|
| *H04B 3/46* | (2015.01) |
| *H04B 3/52* | (2006.01) |
| *H04L 29/08* | (2006.01) |
| *H04B 3/14* | (2006.01) |
| *H04B 3/493* | (2015.01) |
| *G01R 31/3181* | (2006.01) |
| *G01R 31/3193* | (2006.01) |
| *H04L 12/64* | (2006.01) |
| *H04L 5/00* | (2006.01) |
| *H04L 27/26* | (2006.01) |

(52) U.S. Cl.
CPC ............. *H04B 3/142* (2013.01); *H04B 3/493* (2015.01); *H04B 3/52* (2013.01); *H04L 41/0631* (2013.01); *H04L 41/0677* (2013.01); *H04L 41/0686* (2013.01); *H04L 41/147* (2013.01); *H04L 43/10* (2013.01); *H04L 43/16* (2013.01); *H04L 67/1097* (2013.01); *H04L 5/0005* (2013.01); *H04L 27/2647* (2013.01); *H04L 2012/6421* (2013.01); *H04Q 2213/13012* (2013.01)

(58) Field of Classification Search
CPC ....... H04B 3/52; H04L 5/005; H04L 27/2647; H04L 41/0631; H04L 41/0677; H04L 41/0686; H04L 41/147; H04L 43/10; H04L 43/16; H04L 67/1097; H04L 2012/6421; H04Q 2213/13012
See application file for complete search history.

(56) References Cited

U.S. PATENT DOCUMENTS

| | | | | |
|---|---|---|---|---|
| 8,305,877 | B2* | 11/2012 | Sabet | H04B 10/03 370/216 |
| 8,526,485 | B2 | 9/2013 | Thompson et al. | |
| 8,837,302 | B2 | 9/2014 | Basile et al. | |
| 8,861,577 | B2 | 10/2014 | Liv et al. | |
| 8,867,371 | B2* | 10/2014 | Bowler | H04L 41/0677 370/242 |
| 8,868,736 | B2 | 10/2014 | Bowler et al. | |
| 8,971,394 | B2 | 3/2015 | Wolcott et al. | |
| 8,989,221 | B2* | 3/2015 | Asati | H04L 41/0853 370/252 |
| 9,003,460 | B2 | 4/2015 | Basile et al. | |
| 9,025,469 | B2 | 5/2015 | Bowler et al. | |
| 9,042,236 | B2 | 5/2015 | Bowler et al. | |
| 9,136,943 | B2 | 9/2015 | Thompson et al. | |
| 9,264,101 | B2 | 2/2016 | Currivan et al. | |
| 9,419,862 | B2* | 8/2016 | Asati | H04L 41/0853 |
| 9,887,737 | B2 | 2/2018 | Jin | |
| 2005/0041799 | A1* | 2/2005 | Pythoud | H04B 3/46 379/400 |
| 2006/0218612 | A1* | 9/2006 | Johnson | H04L 43/0817 725/107 |
| 2007/0059986 | A1 | 3/2007 | Rockwell | |
| 2009/0007210 | A1* | 1/2009 | Nishide | H04H 20/12 725/125 |
| 2011/0243214 | A1 | 10/2011 | Wolcott et al. | |
| 2013/0286852 | A1 | 10/2013 | Bowler et al. | |
| 2014/0003478 | A1 | 1/2014 | Liu et al. | |
| 2015/0256430 | A1* | 9/2015 | Wolcott | H04L 25/03019 370/252 |
| 2017/0310361 | A1 | 10/2017 | Jin | |
| 2017/0310539 | A1 | 10/2017 | Jin | |
| 2017/0310562 | A1 | 10/2017 | Jin | |

OTHER PUBLICATIONS

U.S. Appl. No. 15/372,271, filed Dec. 7, 2016, entitled "Radio Frequency Signal Fault Signature Isolation in Cable Network Environments," Inventor: Hang Jin.
U.S. Appl. No. 15/397,589, filed Jan. 3, 2017, entitled "Hybrid Fibre Coaxial Fault Locationing in Cable Network Environments," Inventor: Hang Jin.
Extended EP Search Report dated Aug. 29, 2017 cited in Application No. 17167423.7, 12 pgs.
Extended EP Search Report dated Aug. 31, 2017 cited in Application No. 17167841.0, 11 pgs.
EP Examination Report dated Aug. 1, 2018, cited in Application No. 17167841.0, 9 pgs.
EP Examination Report dated Aug. 1, 2018, cited in Application No. 17167423.7, 10 pgs.

* cited by examiner

| SEGMENT INDEX | SEGMENT LENGTH(ft) | END DEVICE (TOWARD TO NODE) | | END DEVICE (AWAY FROM NODE) | | LIST OF RELEVANT CMs |
|---|---|---|---|---|---|---|
| | | INDEX | TYPE | INDEX | TYPE | |
| 0 | 145 | 15 | 5 | 8 | 1 | CM0_1, CM0_2, ... |
| 1 | 140 | 18 | 0 | 5 | 1 | CM1_1, CM1_2, ... |
| 2 | 139 | 16 | 4 | 0 | 5 | CM2_1, CM2_2, ... |
| . | . | . | . | . | . | |
| . | . | . | . | . | . | |
| . | . | . | . | . | . | |
| i | L | j1 | n | j2 | m | CMi_1, CMi_2, ... |
| . | . | . | . | . | . | |
| . | . | . | . | . | . | |
| . | . | . | . | . | . | |
| | | | | | | |

FIG. 20

| DEVICES | | LIST OF RELEVANT CMs |
|---|---|---|
| DEVICE INDEX | DEVICE TYPE | |
| 0 | 5 | CM0_1, CM0_2, ... |
| 1 | 2 | CM1_1, CM1_2, ... |
| 2 | 3 | CM2_1, CM2_2, ... |
| . | . | |
| i | N | CMi_1, CMi_2, ... |

FIG. 28

HYBRID FIBRE COAXIAL FAULT CLASSIFICATION IN CABLE NETWORK ENVIRONMENTS

CROSS-REFERENCE TO RELATED APPLICATION

This application claims the benefit of priority under 35 U.S.C. § 119(e) to U.S. Provisional Application Ser. No. 62/327,159, entitled "PREDICTIVE SERVICES MANAGEMENT IN CABLE NETWORKS," filed on Apr. 25, 2016, which is hereby incorporated by reference in its entirety.

TECHNICAL FIELD

This disclosure relates in general to the field of communications and, more particularly, to hybrid fibre coaxial ("HFC") fault classification in cable network environments.

BACKGROUND

Consumer appetite for bandwidth continues to grow exponentially, challenging competition in the cable network market. Cable operators are constantly seeking ways to boost profits and free cash flow in part by lowering costs. Costs can be reduced in various ways, for example, by proactively responding to network problems using predictive solutions such as monitoring to relieve a problem before an outage occurs and by improving efficiencies in maintenance, for example by accurately deploying the right resources at the right time in the right place. Monitoring may be implemented in cable networks employing Data Over Cable Service Interface Specification ("DOCSIS") standards for operation by using DOCSIS devices equipped with monitoring tools for plant monitoring purposes. By using these devices as network probes, cable operators can collect device and network parameters. Combining the analysis of the collected data along with network topology and device location from a geographical information system ("GIS"), it may be possible to isolate the source of any potential problem before they negatively impact operations. However, currently existing mechanisms for proactively responding to failures in cable networks are limited in various ways.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which:

FIG. 20 is a simplified diagram illustrating a segment table derived from GIS;

FIG. 28 is a simplified diagram illustrating a device relevant table.

DETAILED DESCRIPTION OF EXAMPLE EMBODIMENTS

Overview

One embodiment is a system including a data collector located in a cable network for capturing multi-tone signals traversing the cable network; a data repository located in a cloud network and having an interface for communicating with the data collector and for storing the multi-tone signals captured by the data collector and network data associated with the cable network; and a central server including a memory element storing Predictive Services Management (PSM) algorithms comprising instructions and associated data and a processor operable to execute the PSM algorithms. The central server is configured for detecting a fault in the cable network and identifying a segment associated with the fault; determining a maximum tap magnitude for the fault; calculating an aggregate tap magnitude for the fault; and classifying a severity of the fault based at least in part on the maximum tap magnitude and the aggregate tap magnitude.

Example Embodiments

Figure 1:
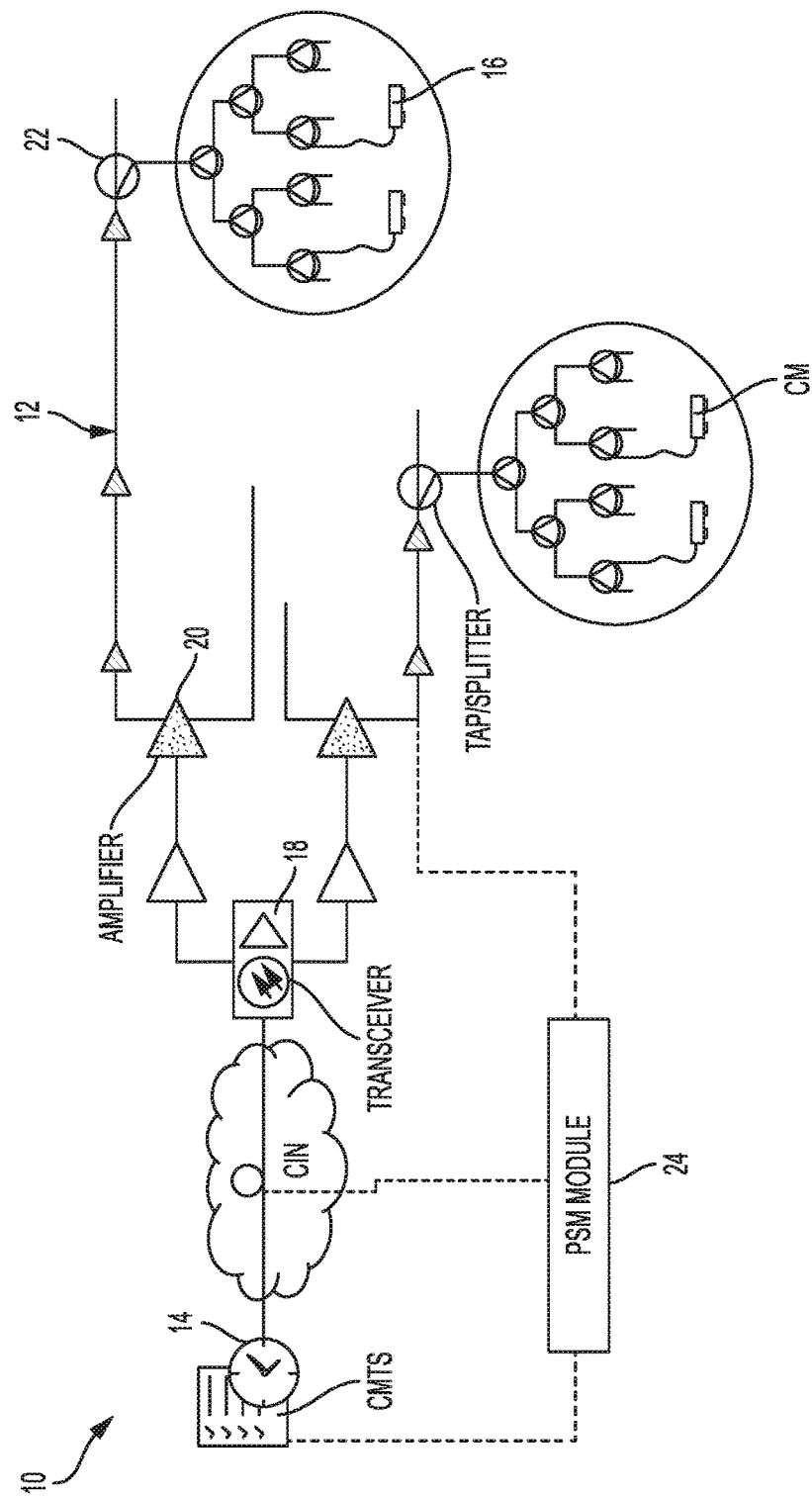
FIG. 1 is a simplified block diagram illustrating a communication system supporting a network architecture for predictive services management in cable network environments.

Turning to FIG. 1, FIG. 1 is a simplified block diagram illustrating a communication system 10 for signal fault signature isolation in cable network environments in accordance with one example embodiment. FIG. 1 illustrates a cable network 12 (indicated generally by an arrow) facilitating communication between a cable modem termination system ("CMTS") 14 and one or more DOCSIS terminal devices 16 such as cable modems ("CMs"). Note that in various embodiments, the terminal devices can comprise any one of modem terminal adapters, multimedia terminal adapters, voice-over-IP ("VoIP") terminal adapters, embedded cable modems of DOCSIS set-top gateways or like devices. Terminal devices 16 are connected to a headend (comprising one or more transceiver 18 and CMTS 14) of cable network 12 via nodes such as HFC radio frequency ("RF") amplifiers 20 and passive devices 22 including cabling, taps, splitters, and in-line equalizers. Cable network 12 includes various other components that are not shown in detail in the figure and facilitates communication of multi-tone signals between transceiver 18 and terminal devices 16.

In some embodiments, CMTS 14 is geographically remote from transceiver 18 and connected thereto across a Converged Interconnect Network ("CIN"), which comprises an IP network facilitating communication according to certain specific DOCSIS (and other) protocols. The headend connects to an IP (Internet Protocol) and/or PSTN (Public Switched Telephone Network) network. Data, such as TV programs, audio, video and other data is sent from the headend to the terminal devices. In addition, terminal devices 16 send data upstream towards the headend. Each of the nodes may be connected to multiple terminal devices. In various embodiments, the nodes connect to the headend, and the headend contains a plurality of CMTS units. Each CMTS contains a plurality of transceivers, which communicate with the plurality of terminal devices. For example, each CMTS may have eight or more receivers, and each receiver may communicate with hundreds of terminal devices.

A Predictive Service Management ("PSM") module 24 is provisioned in one or more locations in communication system 10 to facilitate efficient and proactive maintenance of cable network 12. PSM module 24 automatically identifies impending and current network connectivity problems, including failed nodes, degraded nodes, loss of bandwidth, etc., in cable network 12 before they escalate to affect service. PSM module 24 can also be used to identify any corrective actions to be performed to prevent or correct those problems and/or to eliminate/minimize their impact on customer services. PSM module 24 further enables authorized users to obtain a deeper understanding of network behavior on a granular level, for example, to a single serving group and even to an individual customer. PSM module 24 can provide intelligence and massive data interpretation capabilities, thereby pinpointing the source(s) of network problems and providing recommended actions to correct the problem(s). On a technical level, PSM module 24 can be capable of managing tens of terabytes of historical network device operating information, while simultaneously providing real-time inquiry and access to the most recent information from network devices and customer premises equipment (CPE), such as cable modems and other terminal devices 16.

PSM module 24 uses pre-equalization coefficients as a metric to determine and identify faults in cable network 12. In one embodiment, PSM module 24 identifies a fault signature, and the identified fault signature triggers further operational maintenance of cable network 12. For example, the identified fault signature triggers fault locationing and fault classification operations in PSM module 24; in another example, the identified fault signature triggers a call to a field technician or network operator. In various embodiments, adverse effects of group delay are eased through algorithmic methods, for example, to improve accuracy of the signal fault signature identification.

In a general sense, HFC components, such as amplifiers 20, passive devices 22 and terminal devices 16 cause signal impairment in cable network 12 including by return loss, isolation, mixing, and combining. For instance, reflections (including micro-reflections) may be caused by a length of cable connecting two devices with poor return loss, acting as signal reflectors. Any HFC component has the potential to reflect signals. Typical CMs are configured for a design limit of 6 dB return loss whereas other components typically reflect a lower percentage of incident power.

To mitigate such signal losses, pre-equalization is generally implemented in cable network 12. For each channel of the signal (e.g., comprising data signals carried on a carrier of a particular frequency), an equalizer (comprising an electrical circuit) generates coefficients used in a digital equalizing filter that processes incoming signals with the coefficients for an inverse channel response, canceling distortions in the channel from the upstream channel impairments. In effect, the electrical circuit creates a digital filter that has approximately the opposite complex frequency response of the channel through which the signal is to be transmitted. DOCSIS 2.0 and DOCSIS 3.0 specify twenty-four symbol-spaced complex coefficients, also referred to as taps. The pre-equalization coefficients are used for amplitude and phase correction over a twenty-four symbol period time window.

Cable modems and other such terminal devices 16 typically implement pre-equalization to mitigate upstream channel impairments (e.g., for signals transmitted from CMs towards CMTS 14). The upstream pre-equalization mechanism relies on interactions of DOCSIS ranging processes for determining and adjusting the pre-equalization coefficients. In various systems, CMTS 14 computes the pre-equalization coefficients for each of terminal devices 16, and provide them to the respective ones of terminal devices 16. Appropriate digital filters at terminal devices 16 use their respective pre-equalization coefficients to pre-distort upstream signals to compensate for known (e.g., expected and/or pre-measured) upstream path distortions (e.g., linear impairments), so that as the pre-distorted upstream signal travels through cable network 12 it is corrected and arrives free of distortion at CMTS 14.

CableLabs® Proactive Network Maintenance ("PNM") system discloses a method for fault identification and isolation using pre-equalization coefficients. According to PNM, CMs and CMTSs are polled to obtain pre-equalization coefficient data from all configured upstream channels. The gathered data is verified for format integrity and is normalized to be useful for comparison. For scalability purposes, the data collection process is conducted using a more frequent polling cycle for CMs that exhibited apparent distortion above a pre-determined level and a less frequent cycle for other CMs. The distortion is determined based on non-main tap to total energy ("NMTER") ratio. A detailed analysis is conducted including calibration and determination of distortion signatures from frequency domain and time domain analysis.

With pre equalization coefficients, the approximate distance between two reflection points can be determined. Each one of the taps of the pre-equalization coefficients represents energy in the signal during a period of time. Taps of the pre-equalization coefficients that indicate more energy represent a reflection point. In other words, each of the taps relates to a time period based on the symbol rate of the channel. When a tap is elevated in power level amplitude, it indicates an impedance mismatch at that time period. Thus, comparing the tap energy of the signal with an expected value of the tap energy indicates an anomaly in the signal, possibly caused by a fault. The separation of the faulty tap from the main tap in time domain indicates a corresponding distance of the reflection point.

However, the distortion signatures detected by PNM include group delay and micro-reflections. In other words, PNM does not isolate or remove the effect of group delay for distortion signature determination. However, group delay can smear and smooth taps, making it difficult to isolate relevant (e.g., distinctive) taps indicative of faults in the network at accuracies of 10 feet. Therefore, the PNM technique is not sufficiently accurate to detect faults in the presence of significant group delay.

Group delay is the negative derivative of radian phase with respect to radian frequency (according to the Institute of Electrical and Electronics Engineers ("IEEE") Standard Dictionary of Electrical and Electronics Terms). Group delay is expressed mathematically as:

$$GD = -\frac{d\varphi}{d\omega}$$

where GD is group delay in seconds, φ is phase in radians and ω is frequency in radians per second. Group delay is a measure of different frequencies traveling through the same medium at different speeds. If phase-versus-frequency response does not change in proportion to frequency, group delay exists. In a network with no group delay variation or group delay distortion, all frequencies are transmitted through the network in the same amount of time—that is, with equal time delay. If group delay distortion exists, signals at some frequencies travel faster than signals at other frequencies. Common sources of group delay in a cable network 12 include: power coils, diplex filters, band edges and roll off areas, high-pass filters, data-only filters, step attenuators, in-line equalizers with filters, impedance mismatch-related micro reflections, etc.

Group delay can affect fault signature identification in algorithms that use pre-equalization coefficients for detecting faults. A −25 dB tap is generally not detectable in the presence of group delay because side taps can swamp close-in echoes with levels up to −10 dB. Thus, group delay can lead to faulty tap detection or poor accuracy of tap locations (in time). Unlike PNM, PSM module 24, in various embodiments, identifies a fault signature from captured signals in cable network 12 using phase domain analysis (rather than, or in addition to, frequency domain and/or time domain analysis) and compensation for group delay.

For purposes of description, the term "fault signature" comprises an observation of a performance metric that is out of its expected value or range. There can be two aspects in such expected value or range: (1) an absolute threshold: for example, a signal is deemed not norm if its signal level is below −20 dBmV/6 MHz, or micro-reflections in the pre-equalization coefficients are −25 dB or above with respect to the main tap; and (2) a relative threshold: for example, the observations are examined for consistence, which may be specified with respect to time, frequency, and/or peer (group of CMs). Time consistence may be indicated, for example, if a signal level varies by xdB within N seconds (ms to ms). Frequency consistence may be indicated, for example, if the signal level varies by ydB over a [short] frequency spectrum. Peer consistence may be indicated, for example, if the signal level is zdB below its neighboring CMs.

In a general sense, the absolute threshold norm can be used for downstream ("DS") and upstream ("US") signal level, modulation error ratio ("MER"), signal to noise ratio ("SNR"), forward error correction ("FEC") statistics and pre-equalization coefficients. The relative threshold norm can be used with the same metrics as for the absolute threshold, with the difference being that their respective consistence is evaluated, rather than the absolute values. For example, changes within a short period of time (change within two data polls) (note that slow changes (for example changes due to corrosion) may not be detected); change from carrier to carrier cross spectrum (e.g., with granularity of 6 MHz/6.4 MHz); and change from one group of CMs to others (e.g., based on HFC and CM geo-locations from GIS database). Potentially available metrics include US full band capture, DS full band capture and DS pre-equalization coefficients (if available).

The decision to choose a particular metric for fault signature identification may rely on availability of the metric, its objective nature, and its sensitivity. For example, while it may be desirable to leverage as many metrics as possible, an effective PSM algorithm may be built on metrics that are available currently (and not in the future, for example), and available from most terminal devices 16, if not all. The selection of the metric may be objective, that is, not subject to change by CMTS 14 or HFC dependent. Further, to enable PSM module 24 to detect fault signatures before the fault escalates and affect customer service, the selected metric should have high sensitivity to faults.

In an example embodiment, PSM module 24 uses pre-equalization coefficients as primary metrics, and FEC statistics, signal level and MER as secondary metrics for fault signature identification. Taps in the pre-equalization coefficients are static and self-referred (e.g., uses the main tap), and thus can be a good metric in terms of availability. Among SNR, FEC, MER and pre-equalization coefficients, pre-equalization coefficients provide the most reliable and sensitive fault signature. The taps of pre-equalization coefficients can indicate faults (and location of the faults when combined with additional information) before they escalate and affect network performances. Moreover, the pre-equalization coefficients may be suitably retrieved from various components of cable network 12 using existing mechanisms (e.g., from periodic polls of coefficient values and other relevant physical layer ("PHY") metrics).

In various embodiments, PSM module 24 provides improvements over existing signal fault identification technologies in cable networks by deriving a channel response from pre-equalization coefficients using known techniques, such as reverse minimum mean squared error ("MMSE") or zero forcing ("ZF") equalization algorithms, then starting with the main tap (e.g., tap index 8) of the channel response, searching for an echo in the phase domain for the selected tap in the channel response, finding a specific phase with the echo (e.g., corresponding to a correlation peak), dephasing the channel response, for example, by rotating the channel response with the specific phase, computing a tap amplitude from the dephased channel response, and subtracting the computed tap amplitude from the channel response, thereby removing the effects of group delay. The operations continue to the next tap location.

As used herein, the term "channel response" comprises a mathematical characterization (e.g., model, simulation, quantitative estimation, etc.) of a communication channel (e.g., signal pathway for signals having one or more frequencies or a specific frequency allocation (e.g., in the RF spectrum)). In other words, the channel response models channel behavior (or effect of the channel) on a time-varying signal as it traverses the channel. It is typically a measure of amplitude and phase of the output signal (e.g., as a function of frequency) relative to the input signal.

Group delay cannot be removed from estimation of faults using CableLabs PNM technology. Group delay causes large side taps around the main tap, which can swamp the actual echoes (taps) up to −10 dB (first a few taps). Moreover, the group delays of each individual echoes will smear and smooth the taps, resulting in failed taps detections and poor tap locations. To make the pre-equalization coefficients useful, PSM module 24 removes the effect of the group delays. Thus, PSM module 24 can detect distinctive taps after the effect of group delay is removed and the detection can be performed reliably with magnitude of −25 dB below the main tap and 20 ns accuracy, or approximately 10 ft. of cable length, thereby providing better accuracy than currently existing techniques such as PNM.

Turning to channel response, assume $H(t, \tau)$ is the channel output at time t to an impulse applied at time t−τ, τ representing channel delay. In general, the output r(t) to an input signal s(t) for a linear time variant (LTV) channel is given as:

$$r(t) = \int_{-\infty}^{\infty} s(t - \tau) H(t, \tau) d\tau$$

In a general sense, the channel response simulates (e.g., models, estimates, approximates) errors introduced into the input signal s(t) by the channel. In embodiments of communication system 10, the derived channel response using the pre-equalization coefficients includes substantially all errors in the channel, including group delay. In various embodiments, PSM module 24 includes algorithms for removing the effect of group delay from the estimated channel response (e.g., thereby accounting for group delay in the received signal; estimating contribution of group delay to the received signal; etc.) using phase domain analysis.

PSM module 24 builds on CableLabs PNM to create a service that uses a combination of spectrum information (pre-equalization coefficients) from terminal devices 16, upstream modem data (through DOCSIS Management Information Bases ("MIBs") in near real time), and data analytics. PSM module 24 uses this information to collect and correlate network geodesign and topology data, customer service data, and operating data while accounting for channel effects such as group delay to increase accuracy. The result is a custom developed algorithm that can detect and localize issues before they affect operation and customer satisfaction.

According to an example embodiment, PSM module 24 uses DOCSIS terminal devices 16 as continuous probes (e.g., sensors, measurement devices) throughout cable network 12 to identify and locate plant and subscriber drop problems. PSM module 24 performs trend analysis to predict future faults before they happen. PSM module 24 improves network performance to higher levels for DOCSIS 3.1, by for example, deriving fault signatures from pre-equalization coefficients, searching for responses indicative of the presence of linear distortions, and overlaying terminal device location information on digitized plant maps.

Turning to the infrastructure of communication system 10, the network topology can include any number of cable modems, customer premises equipment, servers, switches (including distributed virtual switches), routers, amplifiers, taps, splitters, combiners and other nodes inter-connected to form a large and complex network. Network 12 represents a series of points or nodes of interconnected communication pathways for receiving and transmitting packets and/or frames of information that are delivered to communication system 10. Note that cable network 12 may also be referred to as a cable plant, and/or HFC network. A node may be any electronic device, computer, printer, hard disk drive, client, server, peer, service, application, or other object capable of sending, receiving, amplifying, splitting, or forwarding signals over communications channels in a network. Elements of FIG. 1 may be coupled to one another through one or more interfaces employing any suitable connection (wired or wireless), which provides a viable pathway for electronic communications. Additionally, any one or more of these elements may be combined or removed from the architecture based on particular configuration needs.

Cable network 12 offers a communicative interface between cable network components, and may include any appropriate architecture or system that facilitates communications in a network environment according to DOCSIS protocols and any other suitable communication protocol for transmitting and receiving data packets within communication system 10. The architecture of the present disclosure may include a configuration capable of DOCSIS, TCP/IP, TDMA, and/or other communications for the electronic transmission or reception of signals in the networks including cable network 12. The architecture of the present disclosure may also operate in conjunction with any suitable protocol, where appropriate and based on particular needs. In addition, gateways, routers, switches, and any other suitable nodes (physical or virtual) may be used to facilitate electronic communication between various nodes in the network.

In some embodiments, a communication link may represent any electronic link supporting a network environment such as, for example, cable, Ethernet, wireless technologies (e.g., IEEE 802.11x), ATM, fiber optics, etc. or any suitable combination thereof. In other embodiments, communication links may represent a remote connection through any appropriate medium (e.g., digital subscriber lines ("DSL"), coaxial fiber, telephone lines, T1 lines, T3 lines, wireless, satellite, fiber optics, cable, Ethernet, etc. or any combination thereof) and/or through any additional networks such as a wide area networks (e.g., the Internet).

Note that the numerical and letter designations assigned to the elements of the FIGUREs do not connote any type of hierarchy; the designations are arbitrary and have been used for purposes of teaching only. Such designations should not be construed in any way to limit their capabilities, functionalities, or applications in the potential environments that may benefit from the features of communication system 10. It should be understood that communication system 10 shown in FIG. 1 is simplified for ease of illustration.

In particular embodiments, CMTS 14 may comprise a hardware appliance with appropriate ports, processors, memory elements, interfaces, and other electrical and electronic components that facilitate the functions described herein, including providing high speed data services, such as cable Internet or voice over Internet Protocol (e.g., in the form of digital, RF, or other suitable signals) to cable subscribers, such as cable modems 16. In various embodiments, CMTS 14 comprises a Universal Broadband Router ("uBR") with features that enable it to communicate with the HFC cable network via a suitable cable modem card, which provides an interface between the uBR protocol control information (PCI) bus and RF signals on the DOCSIS HFC cable network.

In some embodiments, CMTS 14 may comprise a converged cable access platform ("CCAP") core that transmits and receives digital signals in IP protocols, coupled with one or more physical interface ("PHY") transceiver(s), such as transceiver 18 that convert the digital IP signals into RF signals, and vice versa. The PHY transceivers, such as transceiver 18, may be co-located with the CCAP core at a common location, or may be located remote from the CCAP core and connected over a converged interconnect network ("CIN"). In some embodiments, CMTS 14 may comprise a single CCAP core and a plurality of PHY transceivers, such as transceiver 18. CMTS 14 is connected (e.g., communicatively coupled, for example, through wired communication channels) to terminal devices 16, transceiver 18, and other network elements in cable network 12.

Transceivers 18 may comprise suitable hardware components and interfaces for facilitating the operations described herein. In some embodiments, transceivers 18 may be embedded in or be part of another hardware component, such as a broadband processing engine comprising a motherboard, microprocessors and other hardware components. In some embodiments, transceivers 18 comprise downstream and upstream PHY modules, deployed in a Coaxial Media Converter ("CMC") that supports RF functions at the PHY layer. Transceivers 18 may comprise pluggable modules (e.g., small form-factor pluggable ("SFP")) that may be plugged into a network element chassis, or embedded modules that attach to cables directly. In addition to optical and electrical interfaces, transceivers 18 include a PHY chip, appropriate digital signal processors ("DSPs") and application specific integrated circuits ("ASICs") according to particular needs.

Amplifiers 20 comprise RF amplifiers suitable for use in cable network 12. Amplifiers 20 are typically used at intervals in network 12 to overcome cable attenuation and passive losses of electrical signals caused by various factors (e.g., splitting or tapping the coaxial cable). Amplifiers 20 may include trunk amplifiers, distribution amplifiers, line extenders, house amplifier and any other suitable type of amplifier used in cable networks.

In various embodiments, PSM module 24 comprises electrical circuits fabricated on integrated circuits (e.g., digital signal processors ("DSPs"), field programmable gate arrays ("FPGAs"), application specific integrated circuit ("ASICs")), printed circuit boards, or other suitable platforms with appropriate transistors, conductors, resistors and other electrical components for facilitating various operations as described herein. In some embodiments, PSM module 24 is incorporated into CMTS 14; in some other embodiments, PSM module 24 is incorporated into a computing device, such as a server connected to cable network 12; in yet other embodiments, PSM module 24 comprises a stand-alone dedicated device, for example, usable by a cable technician in the field.

Figure 2:
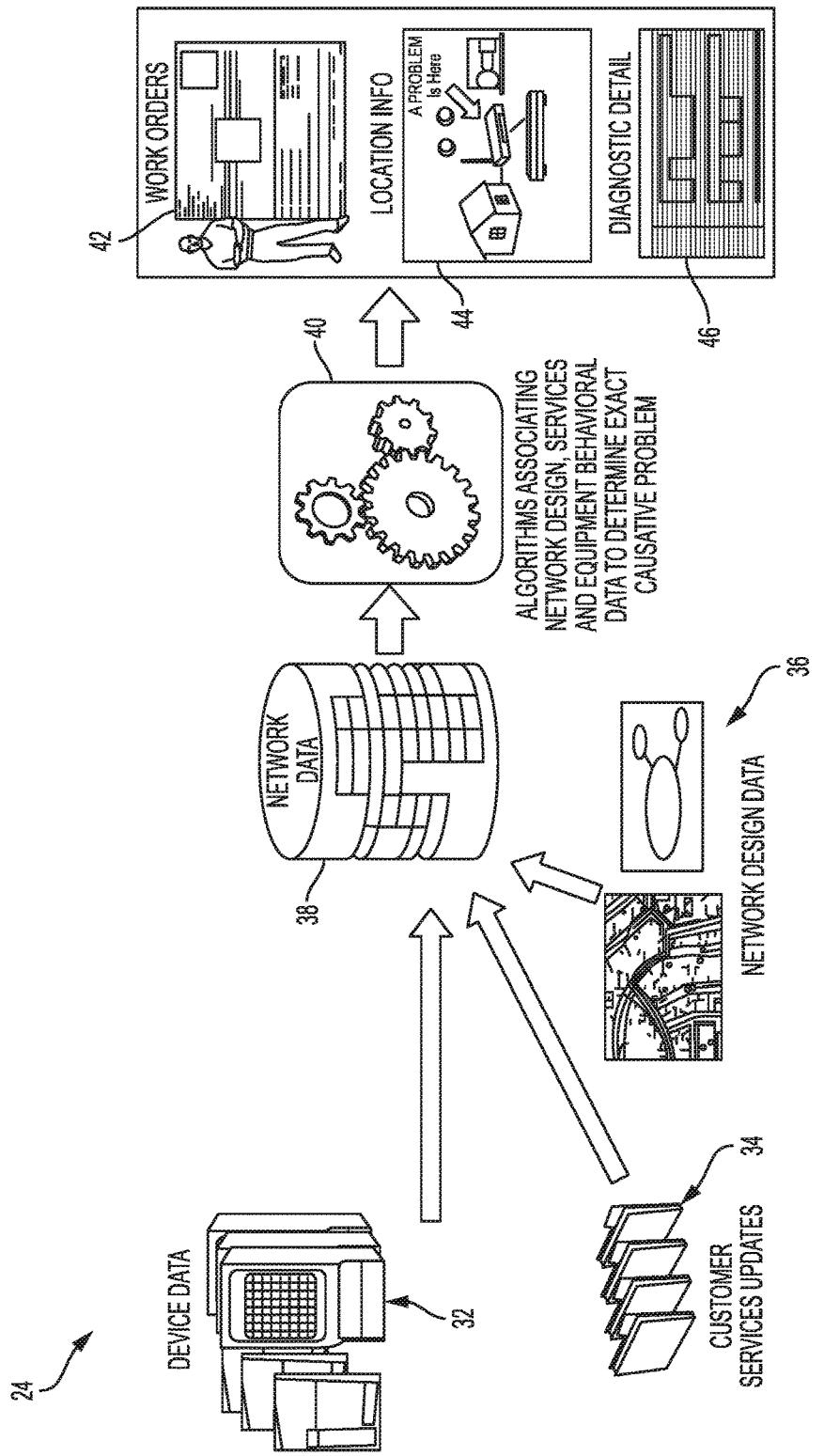
FIG. 2 is a simplified block diagram illustrating example details of a PSM module according to an embodiment of a communication system.

Turning to FIG. 2, FIG. 2 is a simplified diagram illustrating example details of PSM module 24 according to an embodiment of communication system 10. Device data 32, customer services updates 34, network design data 36 (and other data not shown in the figure) are collected and stored as network data 38. Device data 32 comprises device type, device characteristics and other information pertaining to the operation of the respective device in cable network 12. For example, device data 32 includes amplifier make, type, manufacturer number, specifications, etc. of a specific amplifier in cable network 12. Customer services updates 34 includes subscriber information, such as authorized network services, subscribed services, subscribed bandwidth, subscriber quality of service, and other information relevant to network services at individual customer sites in cable network 12. Network design data 36 comprises GIS data, associating devices in cable network 12 with specific geographic information.

PSM algorithms 40 execute on network data 38 to troubleshoot cable network 12 and determine causative problems therein. As used herein, the term "algorithm" refers to a self-contained process comprised of a set of conditional rules and step-by-step operations to be followed in problem-solving analysis. PSM algorithms 40 facilitate computations that, when executed, proceeds through a finite number of well-defined successive deterministic (e.g., non-random) states, eventually producing an output and terminating at a final ending state. In other words, PSM algorithms 40 take as input network data 38, perform computations thereon, and produce one or more outputs that affect network diagnostics operations of cable network 12. In an example embodiment, PSM algorithms 40 comprise instructions executable by a processor and data associated therewith.

Work orders 42, fault location information 44 and diagnostic details 46 are generated based on the results of execution of PSM algorithms 40. A key aspect of PSM module 24 is detecting pending network problems before they negatively affect customers. PSM module 24 provides a supportive platform intended to advice network operators and field technicians on faults in cable network 12 and potential resolutions thereto.

Figure 3:
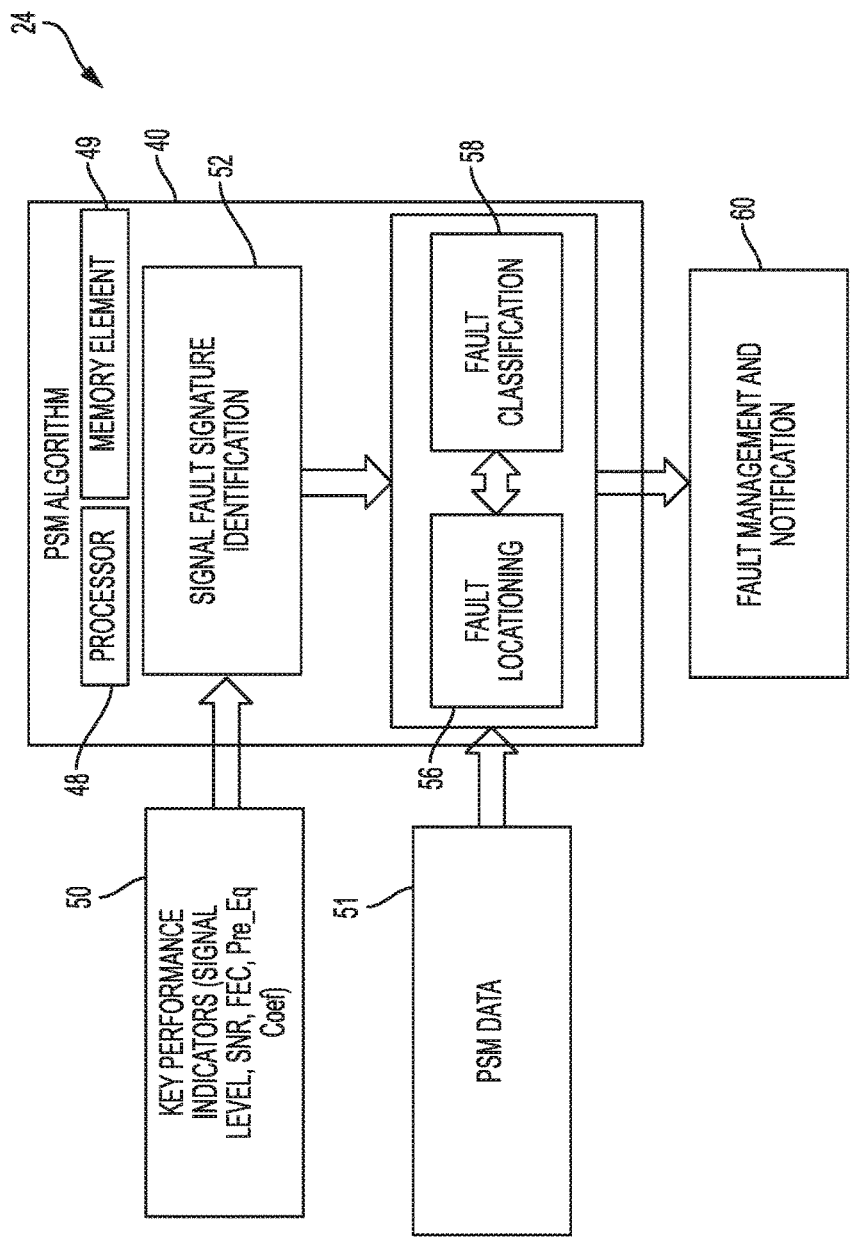
FIG. 3 is a simplified block diagram illustrating example details of a PSM module according to an embodiment of a communication system.

Turning to FIG. 3, FIG. 3 is a simplified diagram illustrating example details of PSM module 24 according to an embodiment of communication system 10. A processor 48 and a memory element 49 for storing instructions and data associated with PSM algorithm 40 are included in PSM module 24. In various embodiments, processor 48 operates in conjunction with memory element 49 to execute PSM algorithm 40. In an example embodiment, PSM module 24 is fabricated on an integrated circuit, for example, an application specific integrated circuit (ASIC).

Network data 38 includes Key Performance Indicators (KPI) 50, comprising signal levels, signal-to-noise-ratio (SNR), forward error correction (FEC), and pre-equalization coefficients and PSM data 51, comprising all other information relevant to fault detection, isolation, and maintenance, including device data, geographical information system (GIS) data, customer subscriber information, etc. KPI 50 and PSM data 51 are provided to PSM algorithm 40. In various embodiments, pre-equalization coefficients are used as primary indicators of faults, and SNR, FEC and signal levels are used as secondary indicators of faults. In various embodiments, the pre-equalization coefficients may be obtained by periodic polling of terminal devices 16, whereas the secondary indicators may be obtained from a full spectrum capture of signals traversing cable network 12 in real time.

GIS data may be provided as PSM data 51 from GIS databases (e.g., storing geospatial data (e.g., data defined spatially (in location) by four dimensions (geometry (e.g., latitude, longitude, depth) and time) related to the Earth), network information and GPS maps for various uses). In some embodiments, monitoring and signal leakage information in cable network 12 are collected and linked in the GIS database to tie together relevant network information, trouble, leakage, weather events, traffic congestion, etc. For example, power supplies, optical nodes, amplifiers and other active devices with a DOCSIS based transponder provide performance data back to the CMTS 14. The transponder uses DOCSIS standards for fiber node and power supply monitoring. Automatic signal leakage detection captures radio frequency leakage outbreaks and records with a time/date stamp and GPS location and sends the captured data back to the central GIS database.

In various embodiments, PSM module 24 retrieves KPI 50 from signals traversing cable network 12. A signal fault signature identification algorithm 52 in PSM module 24 uses KPI 50 to identify one or more faults in cable network 12. In an example embodiment, the fault signature is identified based on pre-equalization coefficients and phase domain analysis of a channel response. The fault signature indicates a distance of the fault from a known reflection point in cable network 12. For example, signal fault signature identification algorithm 52 outputs a fault signature indicating that the second tap from the main tap is above a predetermined threshold. The timing of the tap can be used to identify the location of the corresponding fault, for example, that the fault is located 10 ft. from the vicinity of a specific data collector device (e.g., test meter). To explain further, assume that a broken bridge amplifier and a broken coupler, 400 ft apart, cause 10 dB and 7 dB return losses, respectively. The fault will appear as a tap at 920 ns with a level of −24 dB in the channel response (assume 800 ft cable causes extra 7 dB loss and 920 ns delay).

In some embodiments, signal/noise levels and FEC ratio can be used as secondary metrics for fault signature identification and locationing, for example, to increase accuracy. FEC statistics are typically more sensitive than MER (noise) for fault signature identification. Also, FEC has a well-defined boundary (e.g., <$10^{-4}$). However, FEC statistics is not 100% objective, as it depends on the user profile (e.g., QAM order). Moreover, FEC statistics is a long term average, and not a snap-shot of performance at a particular time. In an example embodiment, un-correctable codewords to the total received codewords is used as the metrics for fault signature identification. A determination is made whether the signal/noise and FEC indicate any fault signature. For example, inconsistence across frequency, or time, or peers can indicate faults.

Signal/noise levels can be good indications of signal fault signature when they are evaluated for their consistence. FEC ratio can be evaluated based on an absolute threshold (e.g., $10^{-4}$ or $10^{-5}$ should be an appropriate threshold for triggering fault signature identification.) Nevertheless, due to large naturally occurring variations in signal/noise levels, and the system self-correcting on FEC ratio, it is hard to use them to identify "potential" issues; they are more a binary indication of "working" or "not working". The location accuracy may be improved by jointly applying the two approaches (e.g., determine the location via pre-equalization coefficients and via signal/noise levels and FEC ratio). This can be particularly useful in the cases where multiple faults occur at the same times, and some of the faults are active devices (clipping), and some are passive (impedance mismatch).

PSM module 24 accesses a data repository for geographical information associated with cable network 12, and determines a location of a fault in cable network 12 based on the fault signature and the geographical information. Fault locationing algorithm 56 uses PSM data 51, including GIS data to correlate the identified fault signature with a fault location (e.g., based on signal timing and other considerations). For example, fault locationing algorithm 56 identifies 1 or 2 twenty specific devices in the 10 ft. zone that could be potential fault generators. In some embodiments, GIS data is retrieved from GIS databases (e.g., storing geospatial data (e.g., data defined spatially (in location) by four dimensions (geometry (e.g., latitude, longitude, depth) and time) related to the Earth), network information and GPS maps). In some embodiments, monitoring and signal leakage information in cable network 12 are collected and linked in the GIS database to tie together relevant network information, trouble, leakage, weather events, traffic congestion, etc. For example, power supplies, optical nodes, amplifiers and other active devices with a DOCSIS based transponder provide performance data back to the CMTS 14. The transponder uses DOCSIS standards for fiber node and power supply monitoring. Automatic signal leakage detection captures radio frequency leakage outbreaks and records with a time/date stamp and GPS location and sends the captured data back to the central GIS database, from where it is extracted and provided to PSM algorithm 40.

According to an example embodiment, multiple faults can be located through the procedure of 3D clustering and affected CM threshold. According to 3D clustering, taps and associated tap magnitudes and times are located for the CMs through the fault signature identification algorithm. Valid taps with tap magnitudes greater than a predetermined threshold (e.g., −30 dB) are selected. The selected taps are grouped into multiple sub-groups in a 3D space comprising magnitude, time, and phase. The mean timing for each sub-group is calculated. For each point (e.g., terminal device 16) in the cluster, the mean timing is used to search the GIS database to find relevant segments with a length that best fits the mean timing. Both ends of the segment are tagged as potential fault locations.

In some embodiments, an aggregation point in cable network 12 is identified for terminal devices 16 that show the same fault signature; the aggregation point indicates the fault location. In an example embodiment, a number of affected CMs is determined based on detected taps. An affected CM is one whose detected taps lead to the device being tagged as faulty. Legitimate fault locations have at least a certain preconfigured threshold N affected CMs. For example, merely one CM in a specific geographic area malfunctioning may not indicate a network fault; whereas hundred CMs in the specific geographic area malfunctioning may indicate a network fault. The preconfigured threshold can vary for trunk cables and drop cables. For example, fault locationing may be triggered if 8 devices are found to be reporting faults on a trunk cable; fault locationing may be triggered if 1 device is found to be reporting faults on a drop cable. The potential legitimate fault locations are sorted according to the number of the affected CMs. A preconfigured number of M legitimate fault locations are identified and reported according to the number of the affected CMs.

PSM module 24 accesses the data repository for device information associated with cable network 12 and determines a type of fault based on the location of the fault and the device information. A fault classification algorithm 58 provides additional troubleshooting capabilities by specifying possible fault types associated with the fault signature in the fault location output by fault locationing algorithm 56. For example, fault classification algorithm 58 indicates that the fault signature is associated with an amplifier rather than a passive tap/splitter or a cable, thereby narrowing the fault generator choices to two or three devices.

For fault classification, two aspects may be considered: (1) fault severity; and (2) faulty device type. PSM module 24 outputs three variables as severity indications: (1) maximum tap magnitude: a faulty device may be tagged multiple times, and the maximum tap magnitude may be recorded and outputted for this faulty device; (2) aggregated tap magnitude: a faulty device may be tagged multiple times, and the tap magnitudes are added up and then divided by the number of terminal devices 16 that generate those tagging; the quotient is outputted as the aggregated tap magnitude for the faulty device; and (3) number of affected terminal devices 16. In an example embodiment, the detected fault is classified according to its severity and type. In one example, the severity is indicated with tap magnitudes (max and aggregated) and number of affected terminal devices 16. The device type is retrieved from the GIS database based on its location.

PSM module 24 activates repair and maintenance activities based on the type of fault, location of the fault and the fault signature. A fault management and notification algorithm 60 notifies a network operator about the problem; in some embodiments, fault management and notification algorithm 60 facilitates deploying a field technician to the affected device location to repair the fault before it is a problem for customers.

Figure 4:
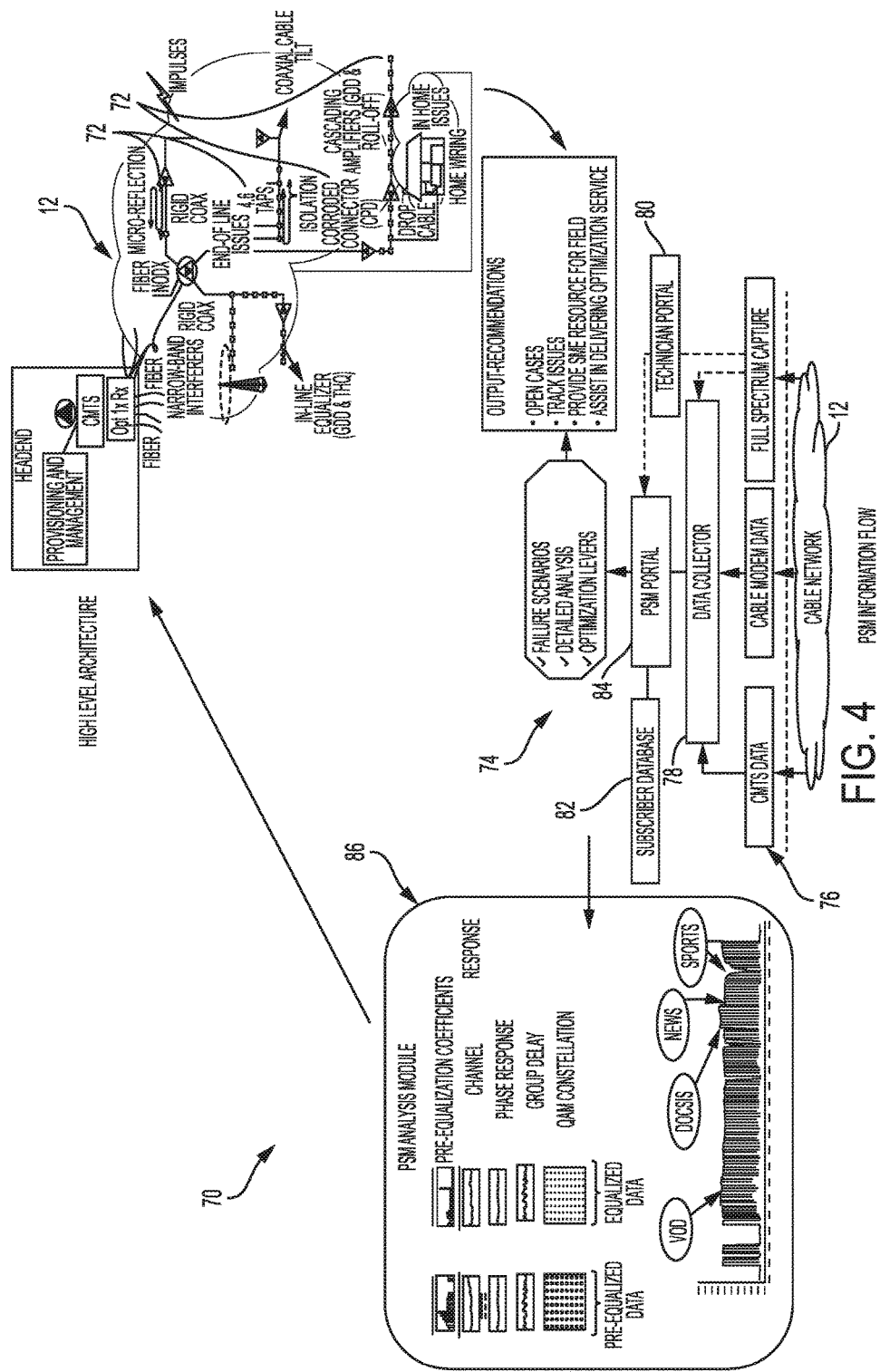
FIG. 4 is a simplified block diagram illustrating example details of a high level architecture of a PSM module according to an embodiment of a communication system.

Turning to FIG. 4, FIG. 4 is a simplified diagram illustrating example details of high level architecture 70 of PSM module 24 according to an embodiment of communication system 10. Faults 72 (e.g., micro-reflections, end-of-line issues, coaxial cable lift, corroded connector, in-home issues, etc.) occur in cable network 12. An example PSM information flow 74 for identifying faults 72, pinpointing respective locations, and providing repair and maintenance recommendations and other relevant information is illustrated in the figure. Various data 76, including CMTS data (e.g., network configuration, DOCSIS MIBs, etc.), cable modem data (e.g., pre-equalization coefficients), and full spectrum capture (e.g., signal levels, SNR, FEC, etc.) are obtained from cable network 12 through (e.g., using) one or more data collector 78. In some embodiments, full spectrum capture may be facilitated through a technician portal 80 rather than through data collector 78.

In some embodiments, data collector 78 includes a stand-alone box configured with electrical circuitry to perform data collection operations, and having ports to connect to cables in cable network 12 and access signals traversing the cables. Data collector 78 may include data ports, signal ports, and other suitable interface to enable it to be connected to the cables and to other devices, such as a smartphone or computer. In other embodiments, data collector 78 comprises electrical circuitry co-located or integrated with cable modems and other DOCSIS terminal devices 16 in cable network 12. In yet other embodiments, data collector 78 comprises electrical circuitry integrated into hand-held or desktop test meters to enable capturing signals in cable network 12. In yet other embodiments, data collector 78 comprises a suitable wireless device, such as a smartphone, configured with special purpose software (e.g., application software) enabling the smartphone to be connected to cables in cable network 12 and capture signals traversing therein.

Captured data 76, along with subscriber information from a subscriber database 82 is fed to a PSM portal 84. PSM portal 84 provides results of failure scenarios analysis, optimization levers to facilitate varying analysis metrics and algorithms (e.g., choosing between reverse ZFE and MMSE algorithms for fault signature identification; choosing a specific type of map from a variety of map types; choosing a specific network service from among various services; etc.), and provides recommendations on open cases, tracked issues, resources for field technicians, and optimization service delivery options. PSM portal 84 enables a network operator to view operations by PSM module 24. PSM analysis module 86 executes PSM algorithms 40 and charts pre-equalization coefficients, channel response, phase response, group delay, and QAM constellations, and various network services (e.g., news, sports, VOD, DOCSIS) based on results of PSM algorithms 40 to enable a network operator, network engineer and other relevant human operator to visualize and comprehend results of analysis by PSM module 24. Results of PSM analysis module 86, including recommendations for field technicians, maintenance operations, etc. are returned to cable network 12, to enable preventive measures pro-actively before customer service is disrupted.

Figure 5:
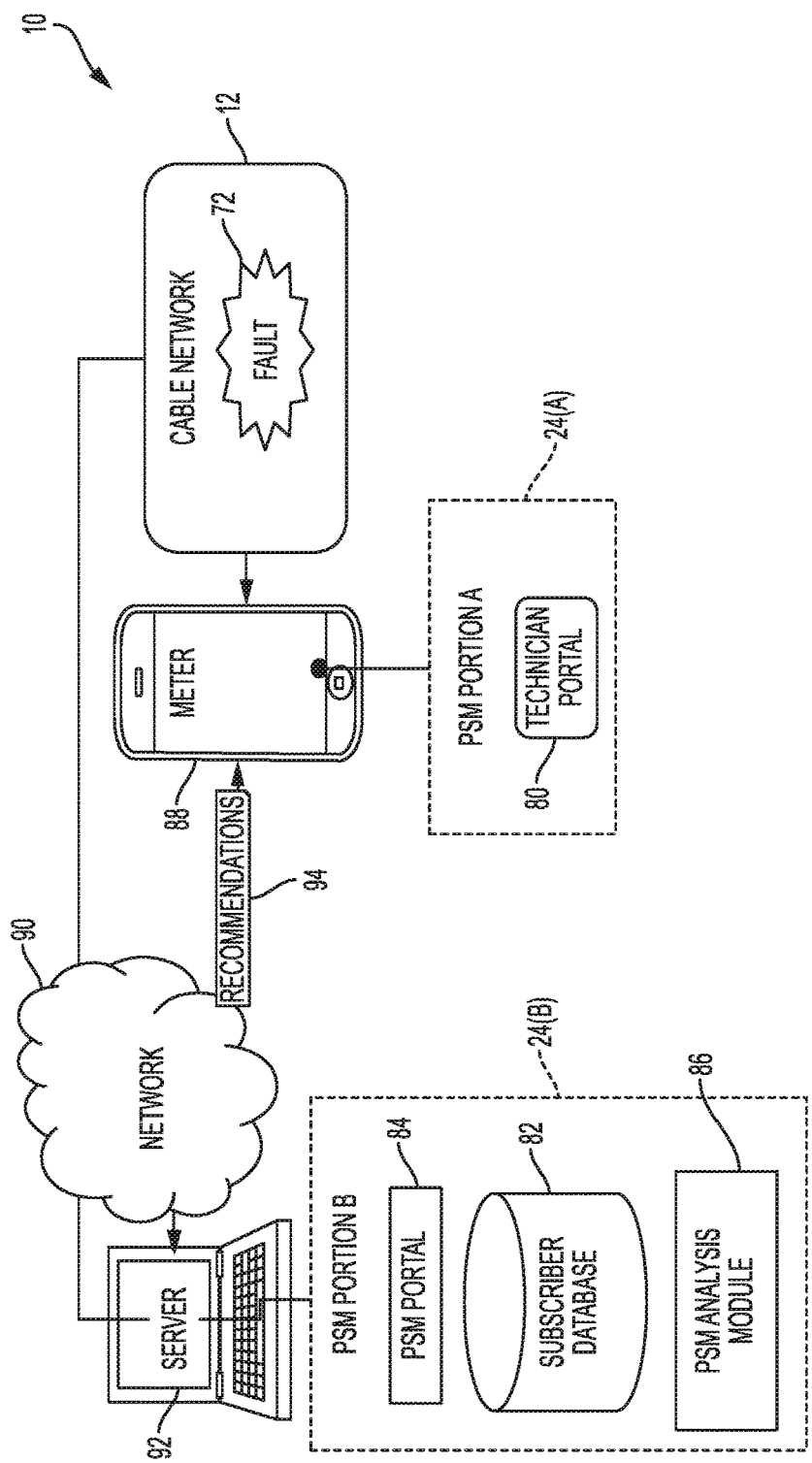
FIG. 5 is a simplified block diagram illustrating example details according to an embodiment of a communication system.

Turning to FIG. 5, FIG. 5 is a simplified diagram illustrating example details according to an embodiment of communication system 10. Cable network 12 includes a fault 72, for example, caused by a malfunctioning device (including cables) that presents unwanted signal reflections. A meter 88 is connected (e.g., by a field technician, network operator, etc.) to cable network 12. In an example embodiment, meter 88 comprises a wireless device, including a wireless phone configured with a special purpose application for performing the operations described herein. In another example embodiment, meter 88 comprises a network test equipment plugged into cable network 12. In an example embodiment, meter 88 is configured with a portion of PSM module 24, for example, 24(A) comprising portion A. In some embodiments, portion 24(A) includes technician portal 80 configured for full spectrum capture from cable network 12.

Meter 88 is connected over a network 90, for example, a wireless network, to a server 92, which is configured with the remaining portion B of PSM module 24, namely 24(B). In many embodiments, portion 24(B) includes PSM portal 84, subscriber database 82, and PSM analysis module 86. Cable network 12 may be connected separately to server 92, for example, over network 90.

During operation, data 76 from cable network 12 is retrieved and stored in server 92. Data 76 may include CMTS data, cable modem data, network updates, pre-equalization coefficients, thresholds, etc. Pre-equalization coefficients are obtained and stored at server 92, in one embodiment, by periodic polling of cable network 12. A field technician connects meter 88 to cable network 12, for example, inserting it into a cable, or to an amplifier, etc. In some embodiments, meter 88 receives signals from cable network 12 for full spectrum capture; meter 88 sends the full spectrum capture over network 90 to server 92. PSM module portion 24(B) analyzes data 76, including the full spectrum capture, and data from subscriber database 82 and provides recommendations 94 to PSM module portion 24(A) executing in meter 88. Recommendations 94 can include, by way of examples and not as limitations, instructions for additional checks or signal captures, repair procedures, corrective actions, preventive measures, etc. that enable a field technician to troubleshoot and repair fault 72.

In some embodiments, PSM module portion 24(A) may be provisioned with a presentation layer that displays network topology, services, device data and pending issues on standard mapping systems (e.g. Google Maps or equivalent) and as data table overlays capable of being rendered by any user IP devices (Smartphones, tablets, computers, etc.) that support a standard browser (Explorer, Firefox, Opera, etc.) using HTML5 and Java. The presentation layer (e.g., included in technician portal 80) includes the ability to display the geography and customer locations affected by the problem, the location (s) where corrective actions are recommended, and the ability to drill down to review the current and historical values for parameters on any device selected. In some embodiments, the presentation layer also includes an ability to focus only on relevant parameters triggering fault 72, whether on one or across multiple devices.

Figure 6:
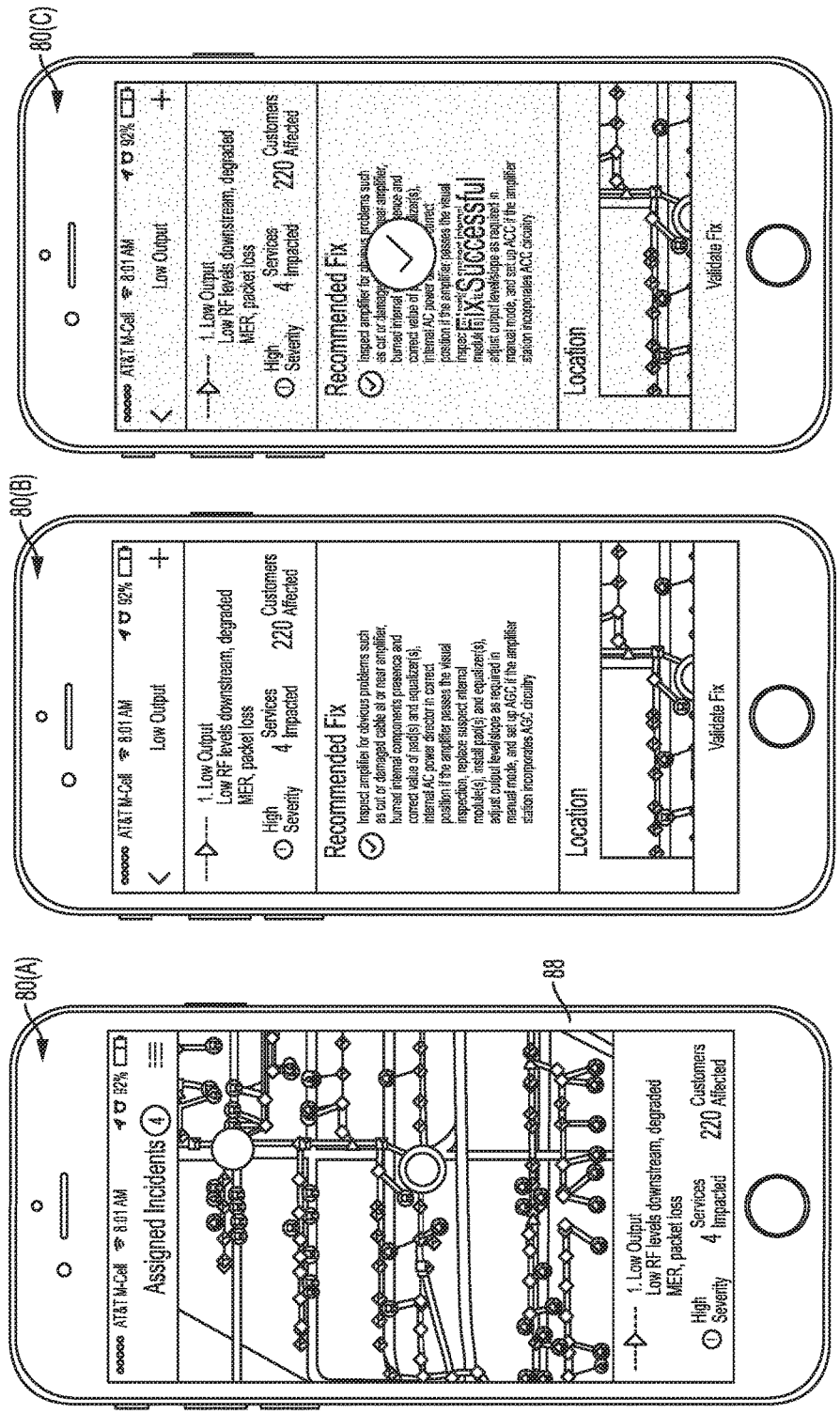
FIG. 6 is a simplified block diagram illustrating example details of a technician portal according to embodiments of a communication system.

Turning to FIG. 6, FIG. 6 is a simplified diagram illustrating example details of technician portal 80 according to embodiments of communication system 10. Technician portal 80(A) shows a view of identified faults and respective locations in cable network 12 overlaid on a map, such as Google Maps in a suitable test meter 88, which comprises a Smartphone in the example shown. One of the identified faults (indicated merely for example purposes as a large circle) is highlighted for the technician's field support activities. PSM module 24 executing in server 92 may suggest a recommended fix, which is displayed in technician portal 80(B). The technician may implement the fix manually, and meter 88 may validate the fix thereafter, for example, by obtaining a set of signals from cable network 12 at the fault location. Meter 88 may transmit the set of signals to server 92 in appropriate data packets or other communication means. PSM module 24 executing in server 92 analyzes the set of signals and determines that the fault is no longer present. A "fix successful" message may be transmitted from server 92 to meter 88 and displayed on technician portal 80(C).

Figure 7:
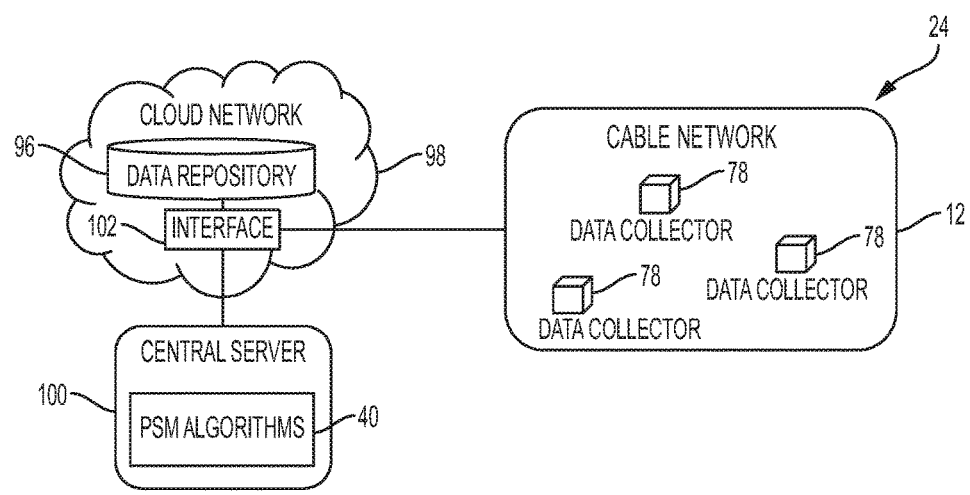
FIG. 7 is a simplified block diagram illustrating example details of a PSM module according to an embodiment of a communication system.

Turning to FIG. 7, FIG. 7 is a simplified diagram illustrating example details of PSM module 24 according to an embodiment of communication system 10. In various embodiments, PSM module 24 may be implemented using one or more data collector 78 deployed in cable network 12, a data repository 96 deployed in a cloud network 98 and a central server 100 in communication with data repository 96 over interface 102 in cloud network 98. Data collector 78 (and associated software to enable functionalities as described herein) may be located at a main network location, or deployed in several locations within cable network 12. Data collector 78 makes queries, collects operations data, including network data 38, and forwards the collected data from network devices in cable network 12 to data repository 96 over interface 102. For example, pre-equalization coefficients are obtained, in one embodiment, by periodic polling of cable network 12 by one or more data collector 78. In some embodiments, data collector 78 is invisible and undetectable to non-authorized users.

Data may be collected according to any suitable data format, including Simple Network Management Protocol (SNMP), In-Plant Reliability Data (IPRD), TR69, DOCSIS MIBs, and others. In some embodiments, data collector 78 may poll network devices, network signals, etc., on a periodic basis; in other embodiments, data collector 78 may be triggered upon occurrence of any unusual event (e.g., signal level deviating from predetermined threshold, etc.). In addition to periodic data collection, data collector 78 also accessed real-time device information in response to specific secure inquiries for specific areas of cable network 12 or specific service flows across cable network 12. Each data collector 78 has a secure means of transferring data to data repository 96.

Data repository 96 provides long-term storage of network data 38, including historical data received from data collector 78. In an example embodiment, data repository 96 comprises a relational database capable of storing multiple terabytes of data and rapidly accessing the data in response to requests from PSM algorithms 40 executing at central server 100. Data repository 96 comprises a physical non-volatile storage memory element, such as a magnetic disk drive, magnetic tapes, solid state drives, shared disk drives, etc. Data may be stored in data repository 96 in any suitable array, table, or other data structure according to particular needs. Data repository 96 links to data collector 78 with a short-term data buffer that enables fast, real-time inquiries of cable network 12 to determine the current status of one or more network elements therein. Data Repository 96 is capable of managing tens of terabytes of information, stored hierarchically for example, with the most recent information being available to inquiries on virtually a real-time basis.

Interface 102 couples with the cable network's business support system/operations support systems (BSS/OSS) to obtain periodic updates on customer services, addresses and information attributes of network elements, including terminal devices 16, amplifiers 18, etc. at each location (such as type, model number, serial number, IP address, etc.), in addition to information from the operator's network design data base on the "as-built" attributes of cable network 12 (including topology of node, amplifier, tap locations and signal levels at each location).

In various embodiments, PSM algorithms 40 execute on central server 100. Note that the term "central" refers to a logical center rather than a geographical center. In other words, central server 100 may be operated in a centralized manner, for example, with PSM algorithms 40 consolidated and executed under a single application (e.g., software) umbrella. In some embodiments, central server 100 may be operated by an entity independent of cloud network 98 and cable network 12, and communicating with data repository 96 irrespective of its actual geographical location relative to cloud network 98 or cable network 12. In some embodiments, central server 100, data repository 96 and cable network 12 may be controlled and operated by the same organization.

Central server 100 includes a processor (e.g., integrated circuit) and a memory element storing PSM algorithms 40. In some embodiments the processor may itself be physically composed of distributed processors rather than a single processor. In various embodiments, execution of PSM algorithms 40 may be triggered manually (e.g., by a network operator). In other embodiments, PSM algorithms 40 may execute automatically substantially continually. In yet other embodiments, execution of PSM algorithms 40 may be triggered by specific types of data, for example, signal levels falling below a pre-determined threshold.

In a general sense, PSM algorithms 40 examine recent network data 38 and compare it to expected values. Authorized users can view the network topology and status at any time. When one or more variations is discovered, PSM algorithms 40 examine related data, logically determines the location and cause of the change, and recommends corrective action. In some embodiments, the calculated, recommended and corrective information is graphically displayed including the location of the problem, the customer locations (if any) affected by the problem and the underlying data triggering the recommendation. A user, such as a field technician, can drill down on information, including current values, thresholds and historical trend line value for each identified fault signature (and other parameters). In some embodiments, the information is presented on a suitable device, for example, meter 88, via a web-based browser supporting HTML5 and Java, or another appropriate platform.

PSM algorithms 40 may include but are not be limited to the following functions: (1) analyze health of a portion of cable network 12, for example the access network, home network, content distribution network, etc.; (2) analyze health of a service delivered to customers, for example, high-speed data service, broadcast video delivery, network based DVR, IP Video Delivery, voice services, etc.; (3) capable of interpreting queries and reporting on particular network attributes or behaviors, for example service take rates across specific service groups or geographies, theft of service detection, CPE and Network device inventory management, network capacity forecasting and management, etc.; (4) data/file transfer/translation to enable transfer of information on a periodic basis such as network system designs from third party design/mapping systems, network and customer premises device types and locations, customer addresses for each service type from BSS/OSS system; (5) authorization and authentication of data collector 78 and/or users of PSM module 24.

In some embodiments, PSM module 24 may tie in the various functionalities of data collector 78, data repository 96, and PSM algorithms 40 using a suitable presentation layer. The presentation layer is capable of providing views of cable network 12 from the highest level (e.g., network level) down to the individual household (e.g., node level), and be capable of supporting views that segment cable network 12. The presentation layer displays cable network 12 overlaid on a standard mapping system such as Google Maps or equivalent. In some embodiments, the presentation layer uses colors and highlights to show any current or impending network issues for which action is required. Using any standard mapping function, the user (e.g., field technician) can zoom in on the location of faults. The presentation layer is capable of displaying substantially all customer locations that are impacted by a particular problem.

The presentation layer provides views of various device parameters in cable network 12. Selecting an individual device enables the authorized user to examine the data from that device, and to look at historic trend lines for data parameters as well as data thresholds. The presentation layer displays end-to-end context of an individual service to substantially all customers, and specific end-to-end paths of a service for a single customer or a logically connected group of customers. In some embodiments, any user's access to PSM module 24 is limited according to the user's individual authorization levels.

Figure 8:
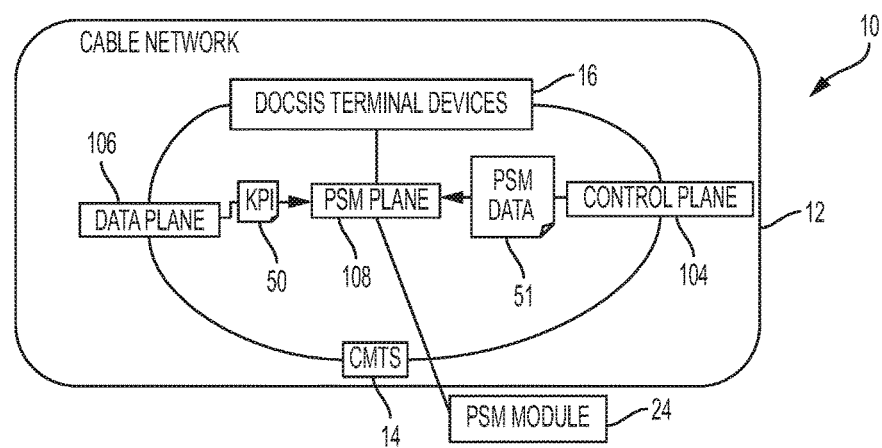
FIG. 8 is a simplified block diagram illustrating example details according to an example embodiment of a communication system.

Turning to FIG. 8, FIG. 8 is a simplified diagram illustrating example details according to an example embodiment of communication system 10. DOCSIS terminal devices 16 communicate with CMTS 14 in cable network 12 over two different planes: a control plane 104, and a data plane 106. In various embodiments, DOCSIS terminal devices 16 communicate with PSM module 24 over a separate plane, namely PSM plane 108. In various embodiments, PSM module 24 may be located outside cable network 12. Control plane 104 facilitates communication of network configuration and management messages, for example, comprised in DOCSIS MIB messages, between CMTS 14 and DOCSIS terminal devices 16. Data plane 106 facilitates communication of data, for example, comprised in a plurality of channels, between CMTS 14 and DOCSIS terminal devices 16. The data can include cable television content, such as news and sports television signals, as well as upstream content for example, user requests for data from DOCSIS terminal devices 16 to CMTS 14.

In various embodiments, signals communicated over data plane 106 may be affected by faults in cable network 12. KPI 50 may be retrieved from such signals and provided over PSM plane 108 to PSM module 24. Further PSM data 51 may be retrieved from signals traversing control plane 104 and provided over PSM plane 108 to PSM module 24. In an example embodiment, the data communicated over PSM plane 108 may be according to proprietary protocols, and may not be subject to DOCSIS specifications, in some embodiments. KPI 50 and PSM data 51 may be packaged into appropriate packets and sent over an IP network, in some embodiments. Various other communication means may be used for communicating data over PSM plane 108.

Figure 9:
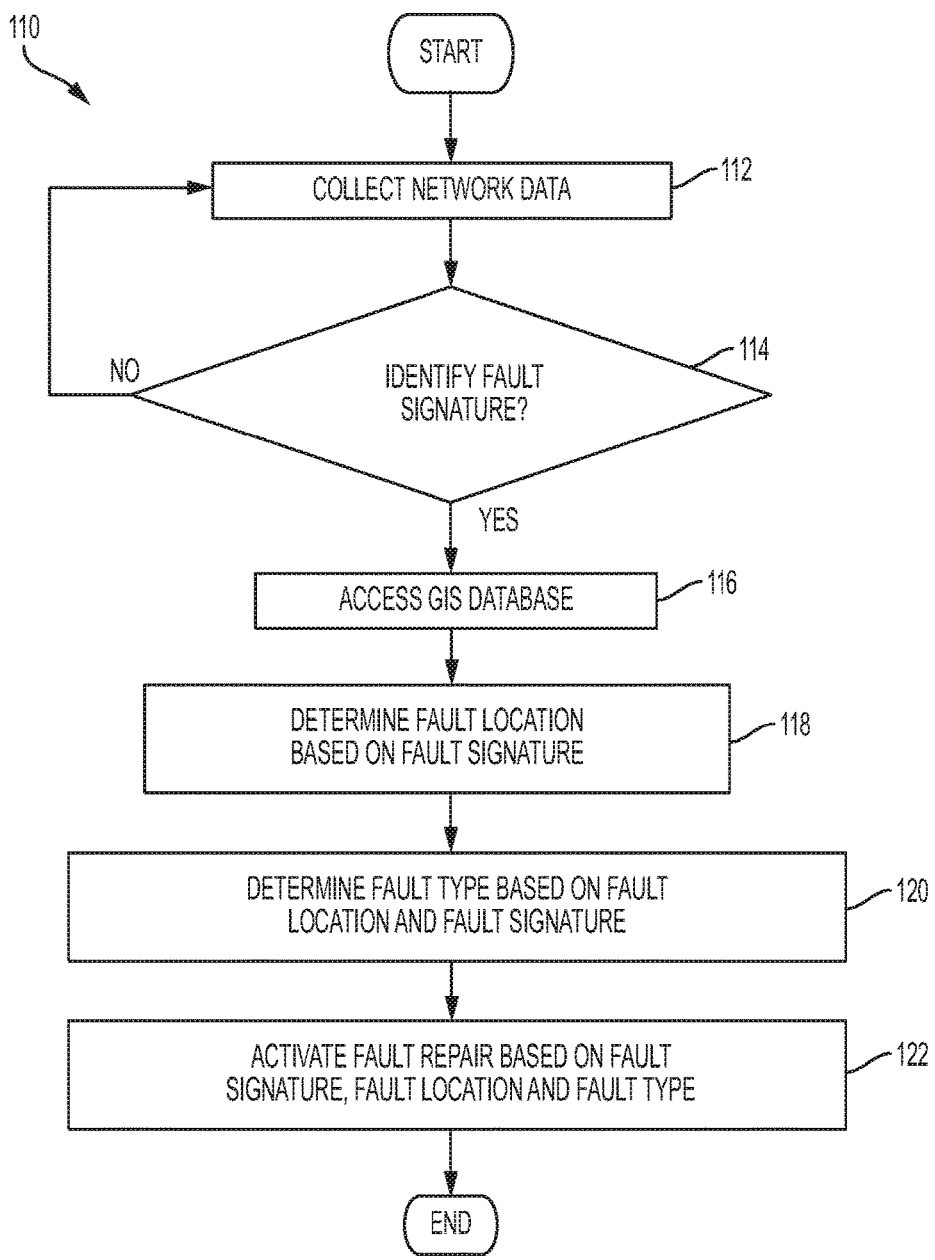
FIG. 9 is a simplified flow diagram illustrating example operations that may be associated with a PSM algorithms of a PSM module.

Turning to FIG. 9, FIG. 9 is a simplified flow diagram illustrating example operations 110 that may be associated with PSM algorithms 40 of PSM module 24. At 112, data collector 78 collects network data 38. At 114, a determination is made from network data 38 whether a fault signature is identified, as described in greater detail below. If a fault signature is not identified, the operations revert back to 112, with continued real-time collection of network data, including KPI 50 and PSM data 51. If a fault signature is identified (e.g., indicative of fault 72 in cable network 12), at 116, a GIS database is accessed. At 118, a fault location is determined based on the identified fault signature and GIS data, as described in greater detail below. At 120, a fault type is estimated based on the fault location and fault signature, as described in greater detail below. At 122, fault repair actions are activated based on the fault signature, estimated fault type and fault location.

Figure 10:
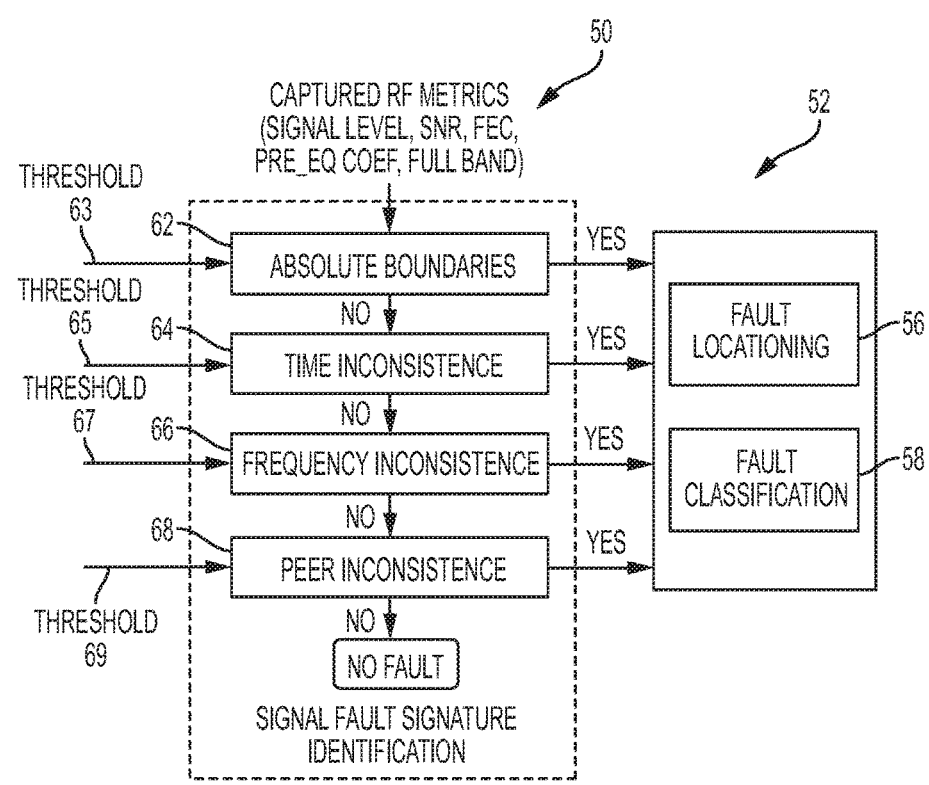
FIG. 10 is a simplified block diagram illustrating example details of a signal fault signature identification algorithm according to an embodiment of a communication system.

Turning to FIG. 10, FIG. 10 is a simplified diagram illustrating example details of signal fault signature identification algorithm 52 according to an embodiment of communication system 10. KPIs 50, including captured RF metrics, are provided as input to signal fault signature identification algorithm 52. An absolute boundaries module 62 checks captured RF metrics 48 against one or more relevant absolute threshold 63. For example, SNR may be checked against an SNR threshold. If the checked metric violates threshold 63, a fault is indicated and fault locationing algorithm 56 and fault classification algorithm 58 may be invoked.

If absolute boundaries module 62 does not detect a fault, a time inconsistence module 64 may compare captured RF metrics 48 against one or more relevant relative time threshold 65. For example, if expected synchronicity of signals is not met, the finding may indicate a fault; in other words, if cable modem A at a distance of X ft. from a testing station can send a signal in m seconds; and another cable modem B at the same distance X ft. from the testing station takes longer than m seconds to send the signal, a fault may be indicated between cable modem B and the testing station. If a fault is indicated, fault locationing algorithm 56 and fault classification algorithm 58 may be invoked.

If time inconsistence module 64 does not detect a fault, a frequency inconsistence module 66 may compare captured RF metrics 48 against one or more relevant relative frequency threshold 67. For example, if the expected frequency of a signal is x, and its measured frequency is y, a fault is indicated. If a fault is indicated, fault locationing algorithm 56 and fault classification algorithm 58 may be invoked.

If frequency inconsistence module 66 does not detect a fault, a peer inconsistence module 66 may compare captured RF metrics 48 against one or more relevant relative peer threshold 69. For example, if two cable modems are unexpected to send signals within x seconds of each other, a finding of a difference from the expected peer threshold may indicate a fault. If a fault is indicated, fault locationing algorithm 56 and fault classification algorithm 58 may be invoked.

Figure 11:
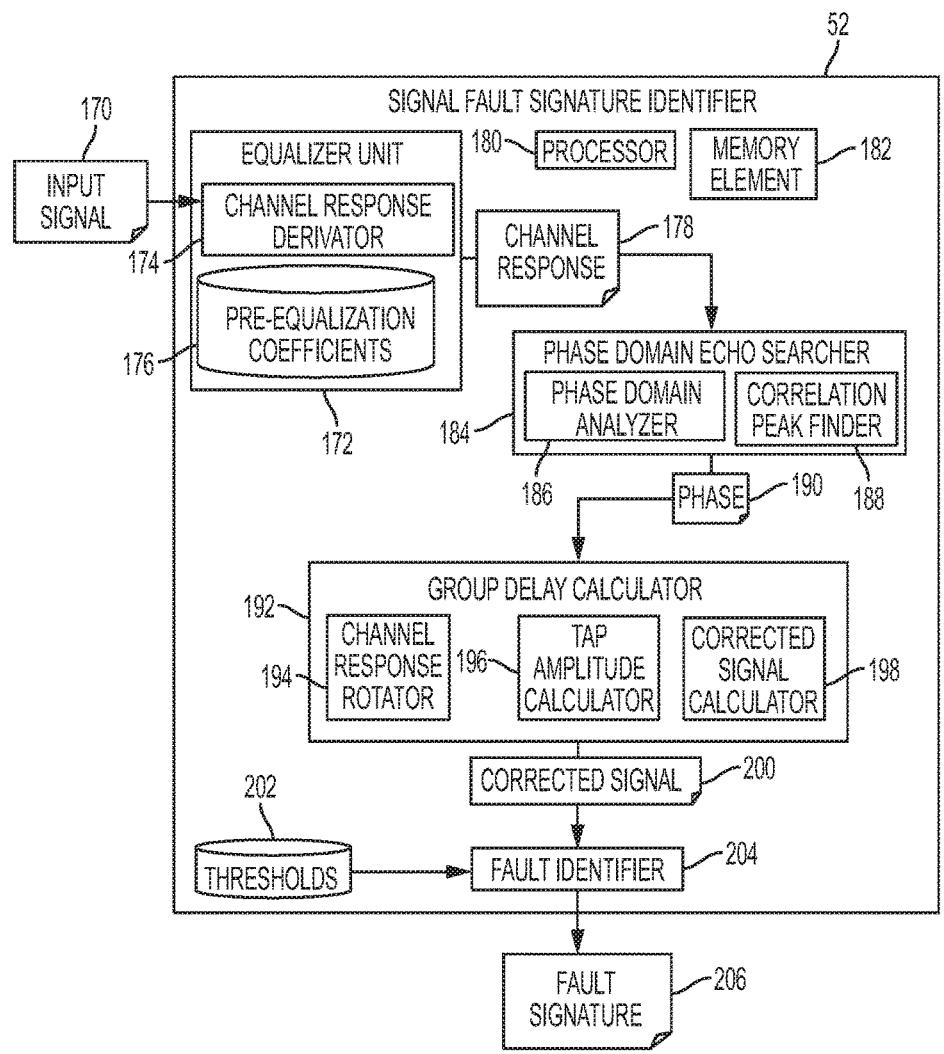
FIG. 11 is a simplified block diagram illustrating example details of a signal fault signature identification algorithm according to an embodiment of a communication system.

Turning to FIG. 11, FIG. 11 is a simplified diagram illustrating example details of signal fault signature identification algorithm 52 according to an embodiment of communication system 10. Signal fault signature identification algorithm 52 receives a multi-tone signal 170 from cable network 12. In an example embodiment, multi-tone input signal 170 comprises data (e.g., comprising digital electrical pulses) carried over electromagnetic waves of discrete frequencies (e.g., carrier waves). In an example embodiment, input signal 170 comprises electromagnetic signals having multiple frequencies in the radio frequency spectrum carried in a tangible medium, such as optical fiber or electrical wire. In another example embodiment, wherein signal fault signature identification algorithm 52 is used in oil pipeline networks, input signal 170 comprises audio waves carried in pipes (e.g., metal pipes, concrete pipes, etc.). An equalizer unit 172 receives signal 170.

In some embodiments, signal 170 comprises pre-equalization coefficients and downstream full spectrum capture. Terminal devices 16 may report their respective pre-equalization coefficients and provide the full spectrum capture when queried by signal fault signature identification algorithm 52. In some embodiments, pre-equalization coefficients are obtained from DOCSIS MIBs and stored at signal fault signature identification algorithm 52 before signal 170 is received. The pre-equalization coefficients are obtained, in one embodiment, by periodic polling of cable network 12 and stored suitably (e.g., in a database, table, array, etc.). In some embodiments, pre-equalization coefficients may be provided through KPIs including captured RF metrics 50.

Equalizer unit 172 includes a channel response derivator 174 and a storage (e.g., database, table, etc.) of stored pre-equalization coefficients 176. In a general sense, an equalization system calculates and applies an inverse filter to a signal that removes distortions to the signal. Equalization estimates the inverse $H_e(f)$ of a channel response $H_c(f)$ and applies it to an incoming signal s(t). Mathematically, the equalization transfer function can be expressed as:

$$H_e(f) = \frac{1}{H_c(f)} = \frac{1}{|H_c(f)|} e^{-j\theta(f)}$$

where $\theta(f)$ is the phase of the channel response, $j=\sqrt{-1}$ and $H_e(f)$ is a function of pre-equalization coefficients. In reverse, knowing the pre-equalization coefficients, $H_e(f)$ can be derived, the inverse of which provides the channel response $H_c(f)$.

One computationally efficient method of forming an inverse filter is the zero-forcing technique, using a zero forcing equalizer (ZFE). In ZFE, the combination of channel and equalizer gives a flat frequency response and linear phase. Another known technique for equalization is by using an MMSE equalizer, which minimizes the mean square error (MSE) in the received signal. The MMSE equalizer adapts the pre-equalization coefficients of the filter to minimize the mean-square error due to noise, interference and intersymbol interference (ISI). The adaptation of the MMSE equalizer is driven by an error signal which indicates to the equalizer the direction that the coefficients should be moved for better accuracy.

If the pre-equalization coefficients are known a priori, channel response 178 can be derived from inverse calculations of the equalization filter, for example, by the inverse of the ZFE or MMSE equalizer. Pre-equalization coefficients 176 comprises twenty-four taps; the main tap (tap index 8) is indicative of the channel without any impairments; in other words, the input signal 170 is perfectly replicated at the output of the channel. Additional taps are indicative of channel impairments. In various embodiments, channel response derivator 174 derives channel response 178 using pre-equalization coefficients 176. Signal fault signature identification algorithm 52 includes a processor 180 and a memory element 182 for facilitating the operations described herein.

Channel response 178 is fed to a phase domain echo searcher 184, comprising a phase domain analyzer 186 and a correlation peak finder 188. Phase domain analyzer 186 analyzes channel response 178 in the phase domain. Phase domain analysis uses phase domain signals (r, θ) rather than classical Cartesian quadrature components (I, Q) for analysis. The phase of channel response 178 comprises the argument of the complex tap values. The impulse response (which is the channel response for an impulse input signal) appears randomized between $-\pi$ and $\pi$, except for the main tap, whose phase correction is 0 radians. In various embodiments, calculation of phase is based on FFT of the pre-equalization coefficients. The phase response, as a function of frequency and the FFT analysis, can be indicated as:

$$\theta(f) = \arg\left[h(t) \xleftrightarrow{FFT} H(f)\right]$$

where H(f) is the equalization transfer function (which is the inverse of the channel response) and h(t) is the equalizer's impulse response.

In an example embodiment, an array of possible phase shifts is estimated and channel response 178 is phase-shifted according to the estimated array. Correlation peak finder 188 determines whether a peak is found, and the specific phase in which the peak occurs. In a general sense, cross-correlation is a measure of similarity of two series as a function of the lag of one relative to the other. It is commonly used for searching a long signal for a shorter, known feature, such as a peak. Cross-correlation is similar in nature to convolution of two functions. In various embodiments, IFFT is applied to the phase-shifted channel response 178 and a correlation peak determined by comparing the phase-shifted channel response with original (i.e., non-phase-shifted) channel response 178.

Phase 190 corresponding to the found peak is determined and provided to group delay calculator 192. A channel response rotator 94 therein rotates channel response 178 with phase 190, and dephased channel response is calculated. A tap amplitude calculator 196 computes the tap indicative of group delay from the de-phased channel response. A corrected signal calculator 198 calculates corrected signal 200, comprising channel response 178 from which the calculated tap amplitude is subtracted. A fault identifier 204 compares corrected signal 200 to thresholds 102 to determine if any unexpected taps are present in signal 170. The operations are continued for each tap of channel response 178. A fault signature 206 is output if a fault is found. Fault signature 206 comprises an observation of a performance metric, for example, one or more taps, that is out of its expected value or range, for example, a threshold for that tap. In an example embodiment, fault signature 206 comprises a tap index (e.g., third tap from the main tap; $5^{th}$ tap from the main tap; etc.); in another example embodiment, fault signature 206 comprises a time index (e.g., 10 μs from meter. Note that any suitable metric indicative of faults in cable network may be provided in fault signature 206.

Figure 12:
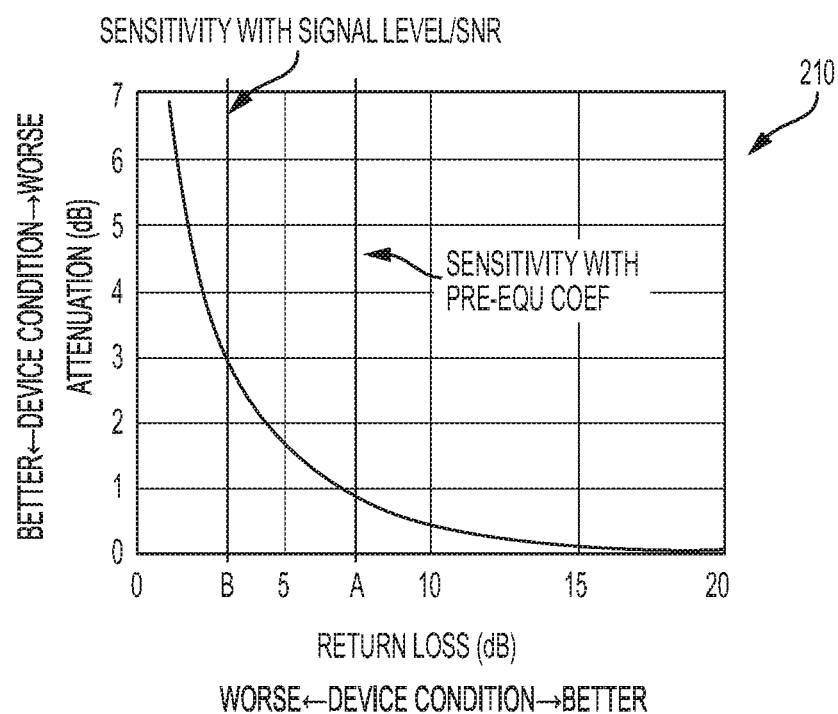
FIG. 12 is a simplified diagram illustrating example details of a sensitivity comparison between SNR and pre-equalization coefficients in relation to fault detection using an attenuation to return-loss curve.

Turning to FIG. 12, FIG. 12 is a simplified diagram illustrating example details of a sensitivity comparison between SNR and pre-equalization coefficients in relation to fault detection using an attenuation to return-loss curve 210. The decision to choose a particular metric for fault signature identification may rely on availability of the metric, its objective nature, and its sensitivity. For example, while it may be desirable to leverage as many metrics as possible, PSM algorithm 40 may be built on metrics that are available currently (e.g., as of the time of analysis) and available from most of CMs 16, if not all. The selection of the metric may be objective, that is, not subject to change by CMTS 14 or HFC dependent (e.g., dependent on topology or network updates in cable network 12, etc.). Further, to enable PSM algorithm 40 to detect fault signatures before the fault escalates and affects customer service, the selected metric should have relatively high sensitivity to faults. In an example embodiment, PSM algorithm 40 uses pre-equalization coefficients as primary metrics, and FEC statistics, signal level and MER as secondary metrics for fault signature identification.

In a general sense, PER is far more sensitive for fault detection than MER. FEC statistics may be also used as a metric. Advantages of using FEC statistics include: (1) FEC statistics is more sensitive than MER (noise) for fault signature identification; (2) FEC has a well-defined boundary (say, <10−4). However, disadvantages include: (1) FEC statistics is not 100% objective, as it depends on the user profile (QAM order); and (2) FEC statistics is a long term average (no snap shot of performance). In some embodiments, the ratio of un-correctable CWs to the total received CWs may be used as the metrics for fault signature identification. FEC statistics depends on QAM order selection. If MER degradation exists, say of the order of 3 dB reduction, CMTS 14 may downgrade the QAM order by 1 level, which will neutralize the adverse effect of the reduced MER. Nevertheless, FEC can be used as the secondary metric.

From attenuation to return-loss curve 210, it may be concluded that pre-equalization coefficients are more sensitive for fault detection than signal level, assuming that fault detection with signal level/SNR uses a 3 dB threshold. Taps with −25 dB can be readily detected (e.g., 25 dB may correspond to 7.5 dB return loss at each end, and extra 10 dB cable loss in between) using pre-equalization coefficients, whereas the same is not possible with signal level or SNR. In a general sense, taps in the pre-equalization coefficients are static and self-referred (e.g., uses the main tap), and thus can be a good metric in terms of availability. Among all the performance metrics mentioned above, pre-equalization coefficients provide the most reliable and sensitive fault signature for purposes discussed herein. The taps of pre-equalization coefficients can indicate faults (and location of the faults when combined with additional information) before they escalate and affect network performances. Moreover, the pre-equalization coefficients may be suitably retrieved from various components of the cable network using existing mechanisms (e.g., from periodic polls of coefficient values and other relevant PHY metrics).

Figure 13:
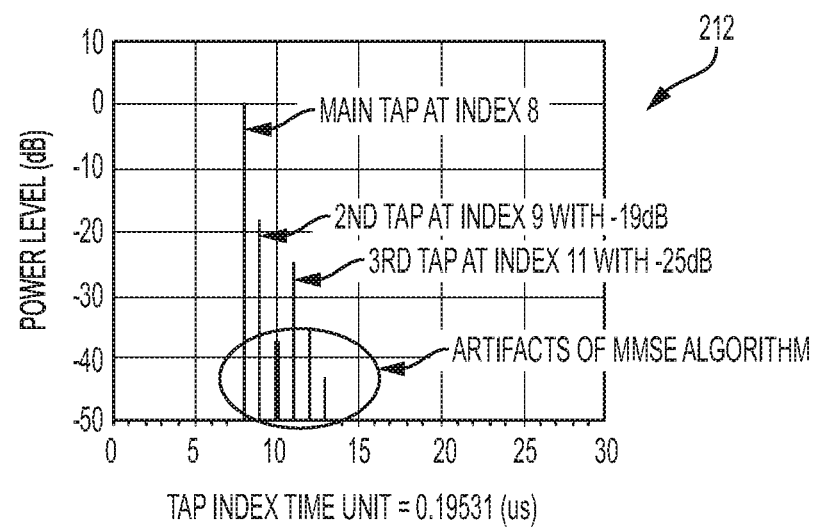
FIG. 13 is a simplified diagram illustrating example details of a graph showing signal power levels as a function of tap index for a specific signal in the absence of group delay.

Turning to FIG. 13, FIG. 13 is a simplified diagram illustrating example details of graph 212 showing signal power levels as a function of tap index for a specific signal in the absence of group delay. The main tap, with maximum power, occurs at tap index 8, followed by the second tap at index 9 with approximately 19 dB attenuation, followed by the third tap at index 11 with approximately 25 dB attenuation. Further attenuation or taps may not be detectable using the algorithms disclosed herein, as they could be artefacts of calculations, approximations, modeling and other mathematical analysis techniques used by signal fault signature identification algorithm 52.

Figure 14:
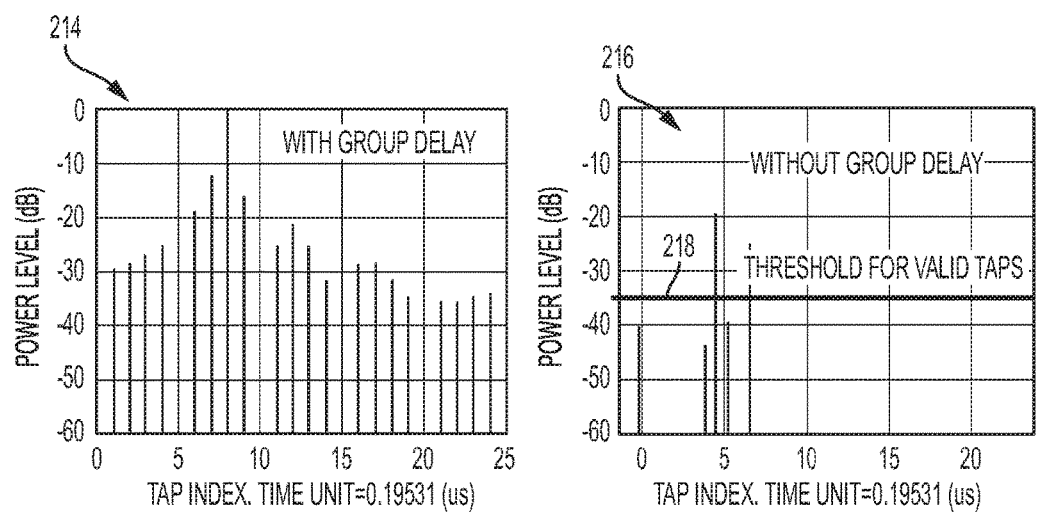
FIG. 14 is a simplified diagram illustrating example details showing the effect of group delay graphs of signal power levels as a function of tap index for a specific signal.

Turning to FIG. 14, FIG. 14 is a simplified diagram illustrating example details showing the effect of group delay through graphs 214 and 216 of signal power levels as a function of tap index for a specific signal. An example PSM algorithm for fault signature is used for tap detection from the channel response. The channel response is derived from the pre-equalization coefficients with the effect of group delays removed through a DSP algorithm. After the effect of group delays is removed, the taps can be detected reliably (note): Magnitude: −25 dB below the main tap; Time: 20 ns accuracy, resulting in 10 ft. accuracy. The taps in the channel response directly link to the echoes of HFC. The tap timing can be used to locate the fault location.

In the presence of group delays, as indicated by graph 214, echoes from faults are swamped by side taps of the main taps, such that it is not possible to differentiate group delay from echoes caused by faults. In the example shown (based on simulations), taps with attenuation of 10 dB can be from group delays rather than faults. Moreover, group delay tends to smear and smooth the taps, resulting in failed taps detections and poor tap locations. Group delay is normal, and cannot be removed from cable network 12. To make the pre-equalization coefficients useful, the effect of the group delays should be removed.

On the other hand, graph 216 indicates distinctive taps from reflections when the effect of group delay is removed. A threshold 218 for valid taps may be compared against the distinctive taps of graph 216 to determine anomalies. For example, any power level greater than threshold 218 indicates a fault; thus taps 3 and 5 to the right of the main tap at 0 may be indicative of faults in cable network 12. Removing group delay effects can thereby improve accuracy of fault prediction.

Figure 15:
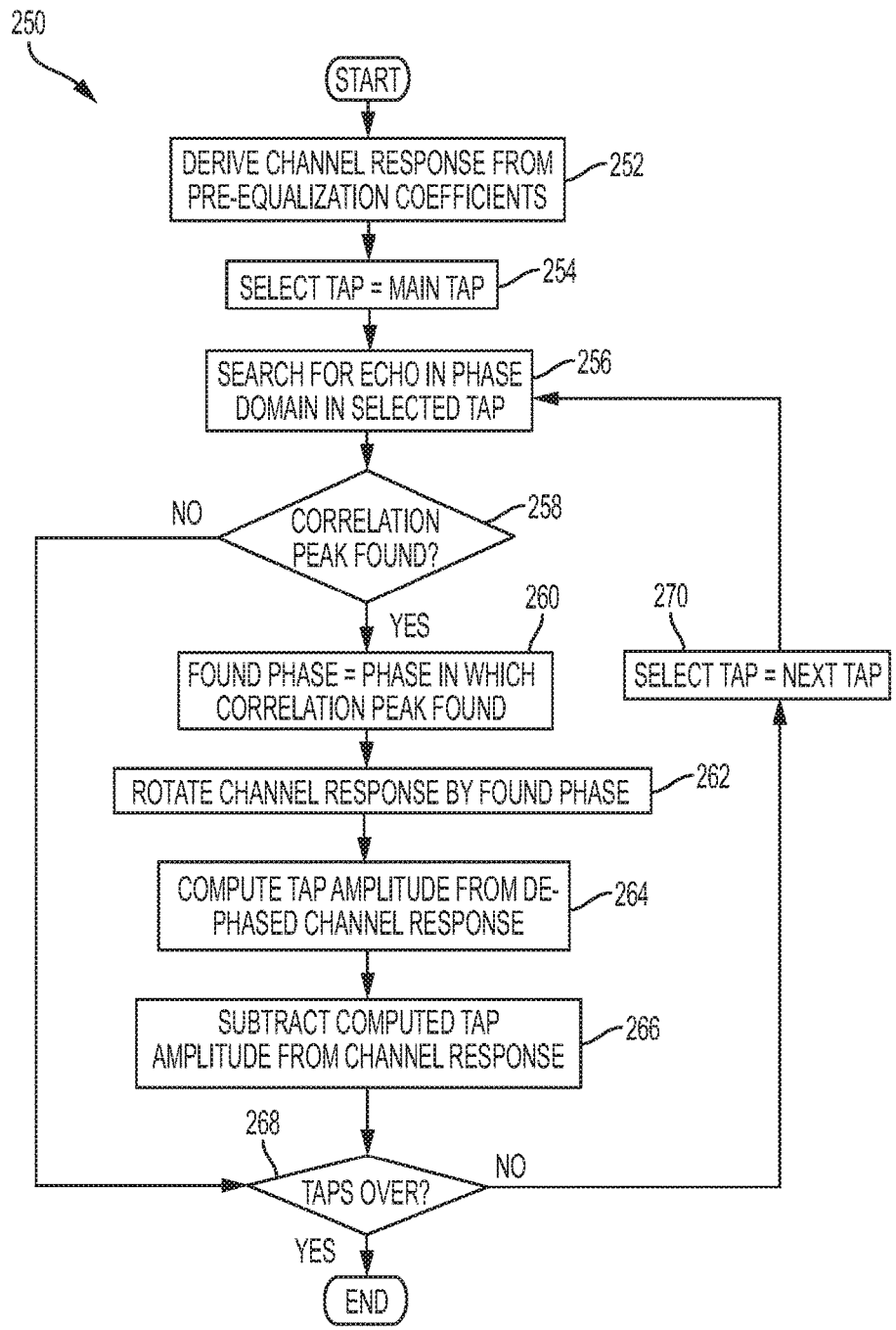
FIG. 15 is a simplified block diagram illustrating example operations that may be associated with embodiments of a signal fault signature identification algorithm of a communication system.

Turning to FIG. 15, FIG. 15 is a simplified flow diagram illustrating example operations 250 that may be associated with embodiments of signal fault signature identification algorithm 52 of communication system 10. At 252, channel response derivator 174 derives channel response 178 from pre-equalization coefficients 176 (which may be derived from multi-tone signal 170). At 254, the first iteration begins by selecting the main tap (e.g., tap index 8) for further analysis. At 256, phase domain echo searcher 184 searches for an echo in phase domain for the selected tap. At 258, a determination is made whether a correlation peak is found. If a correlation peak is found, at 260, the phase corresponding to the correlation peak is set to found phase 190. At 262, channel response 178 is rotated by found phase 190 and de-phased channel response is calculated. At 264, the tap amplitude is determined from the de-phased channel response. At 266, the computed tap amplitude is subtracted from the channel response to remove group delay. At 268, a determination is made whether all relevant taps have been considered. If not, the operations proceed to 270, at which the selected tap is set to the next tap. The operations continue to 256, and proceed thereafter. Turning back to 258, if no correlation peak is found for the selected tap, the operations step to 268, and proceed thereafter. At 268, if all the relevant taps have been considered, the operations end.

Fault locationing and fault classification may depend heavily on fault signature identification and its accuracy. For example, tap timing (position) may be used as a primary metric for location determination. Aggregation point estimation may be based on peer consistence locations. Noise (active device vs. passive devices) may be used as a secondary metric. GIS data (device geo-locations, work with tap locations) may be used to accurately locate the problem in the cable network.

Figure 16:
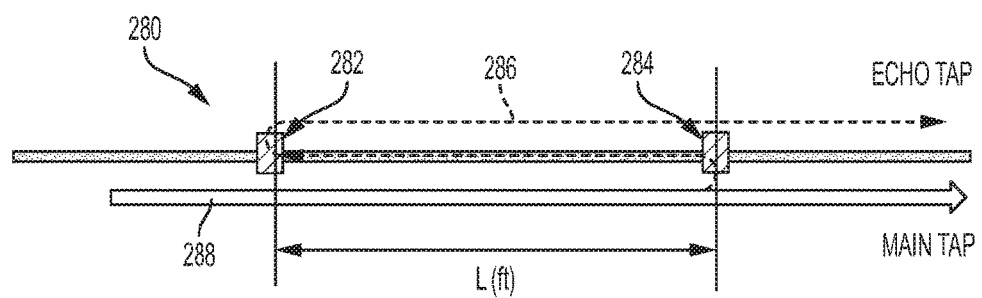
FIG. 16 is a simplified diagram illustrating a portion of a cable network including a first network device and a second network device interconnected by a length of cable L.

In accordance with features of embodiments described herein, the timing (position with respect to the main tap) of the tap in the channel response may be used to identify the location of a fault, as illustrated in FIG. 16. Referring to FIG. 16, illustrated therein is a portion 280 of a cable network including a first network device 282 and a second network device 284 interconnected by a length of cable L. It will be assumed for the sake of example that both devices 282, 284, are defective, resulting in an echo tap 286, the timing of which with respect to a main tap 288 is related to the distance L between the devices 282, 284 (which distance corresponds to the length of a "fault cavity" between the devices). In particular, the timing of the echo tap 386 with respect to the main tap 288 is described by the equation:

$$L(ft.) = Vf * \Delta t/2$$

where Δt is the difference between the main tap and the echo tap in nanoseconds (ns) and Vf is the velocity factor of the cable connecting the devices 282, 284 (Vf=0.87).

Figure 17:
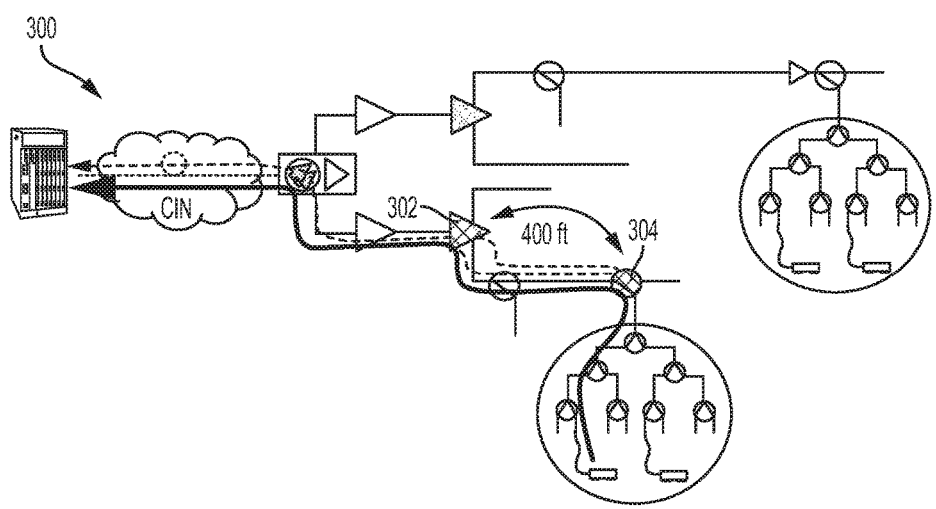
FIG. 17 is a simplified block diagram illustrating a cable network comprising a first network device.

This concept is further illustrated in FIG. 17. In particular, FIG. 17 illustrates a cable network 300 comprising a first network device 302, which in the illustrated embodiment comprises a bridge amplifier, and a second network device 304, which in the illustrated embodiment comprises a coupler, which devices are connected by 400 feet of cable. It will be assumed for the sake of example that both devices 302 and 304 are broken, causing 10 dB and 7 dB return losses, respectively. It will be assumed that 800 feet of cable results in an extra 7 dB loss and a 920 ns delay; therefore, the fault will appear as an echo tap at 920 ns with a level of −24 dB in the channel.

Figure 18:
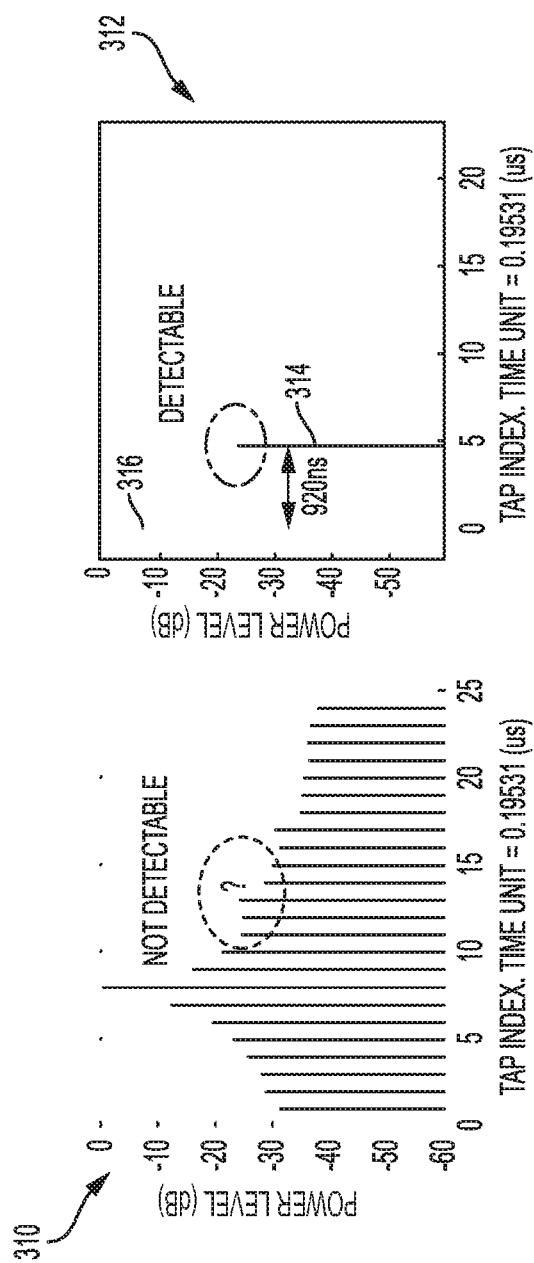
FIG. 18 is a simplified diagram illustrating therein graphs of signal power levels as a function of tap index for a network.

Turning to FIG. 18, illustrated therein are graphs 310, 312, of signal power levels as a function of tap index for the network 300 (FIG. 17) before and after the effect of group delay is removed using a DSP algorithm. As described in detail above, a PSM algorithm such as described herein is used for tap detection from the channel response, which is derived from the pre-equalization coefficients with the effect of group delays removed through a DSP algorithm. In particular, in a graph 310, which illustrates the tap index for the network 300 before the effect of group delay is removed, the echo tap is not detectable. In contrast, in a graph 312, after the effect of group delay is removed, the echo tap (represented in FIG. 18 by a line 314) of −24 dB is detectable 920 seconds after the main tap (represented in FIG. 18 by a line 316).

Figure 19:
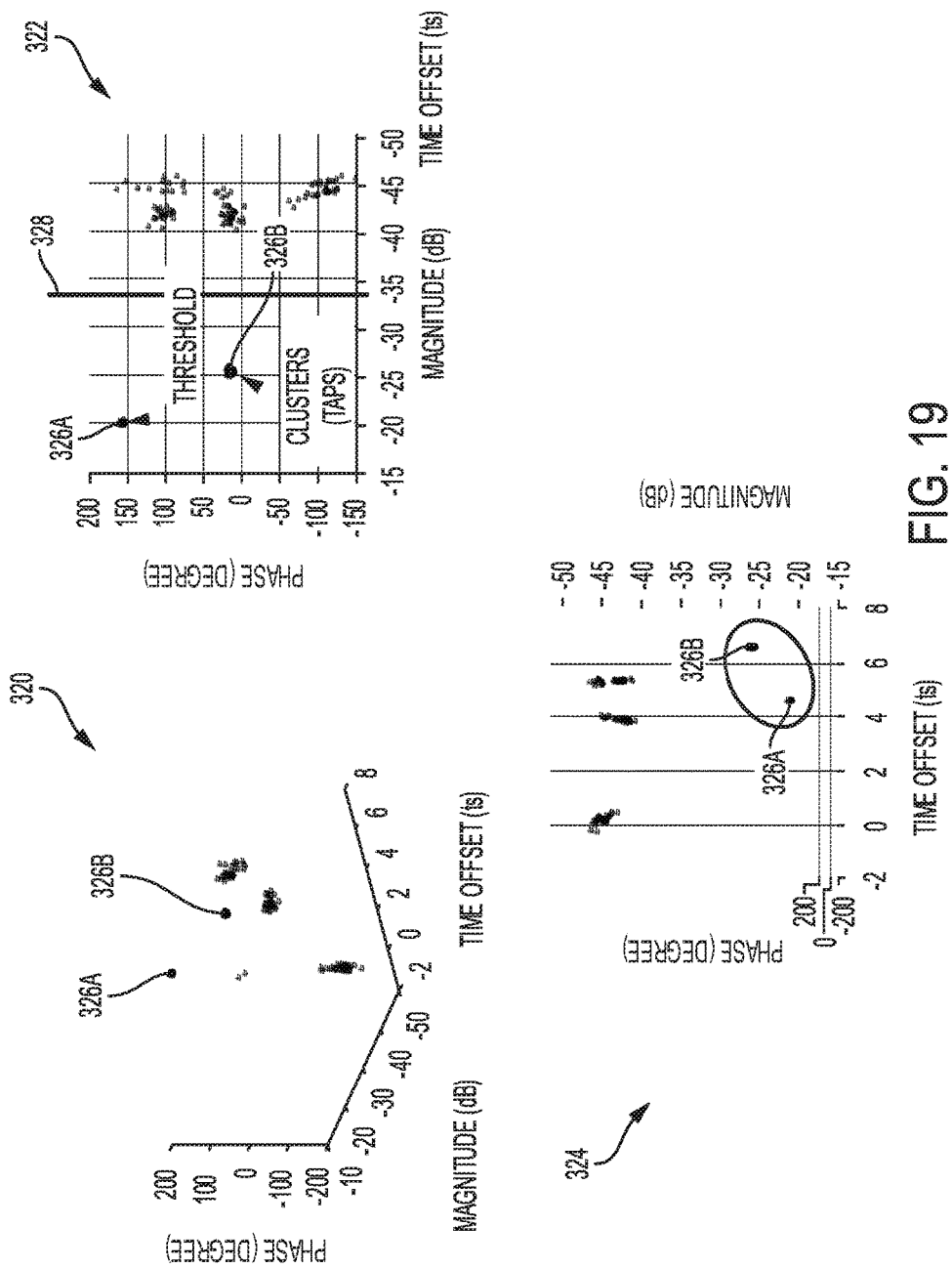
FIG. 19 is a simplified diagram illustrating multiple graphs illustrating use of 3D clustering.

Referring now to FIG. 19, illustrated therein are multiple graphs 320, 322, 324, illustrating use of 3D clustering to locate multiple faults in a network. In 3D clustering, taps and associated tap magnitudes and times are located for the CMs using the fault signature identification algorithm described herein. An example 3D plot of detected taps is illustrated in graph 320. Valid taps with tap magnitudes greater than a predetermined threshold (e.g., −30 dB) are selected. As best shown in graph 322, two clusters of taps 326A, 326B, have magnitudes greater than a threshold, indicated by a line 328. The selected taps are grouped into multiple sub-groups in a 3D space comprising magnitude, time, and phase. The mean timing for each sub-group is calculated. For each point (CM) in the cluster, the mean timing is used to search the GIS data base to find relevant segments with a length that best fits the mean timing. Both ends of the segment are tagged as potential fault locations. As best shown in graph 324, in the example illustrated in FIG. 19, the mean timing for each point in each of the clusters 326A, 326B, will be used to search the GIS database to find the relevant segments with a length that best fits the mean timing, with both ends of each such segment being tagged as a potential fault location.

In certain embodiments, a number of affected CM threshold N is preconfigured based on detected taps. An affected CM is a CM whose detected taps lead to the CM being tagged as defective or faulty. Legitimate fault locations have at least N affected CMs. The preconfigured threshold can vary for trunk cables and drop cables. For example, fault locationing may be triggered if N1 (e.g., 8) devices are found to be reporting faults on a trunk cable, while fault locationing may be triggered if N2 (e.g., 1) devices are found to be reporting faults on a drop cable. The potential legitimate fault locations are sorted according to the number of the affected CMs. A preconfigured number of M (e.3., 3) legitimate fault locations are identified and reported according to the number of the affected CMs.

To facilitate the fault locationing, a segment table is derived from GIS in a format such as illustrated in FIG. 20. A segment is a part of HFC that is continuously interconnected and terminated at each end by an active or passive end device. The terminating devices also belong to, or form part of, the segment, which is a point-to-point connection. A segment table indexes all the segments and the relevant CMs in a single section of a cable network. For each segment (identified by a segment index number) in a section, the segment table indicates the length of the segment (in feet), the terminating devices (by device index number and type), and the CMs relevant to the segment.

Figure 21:
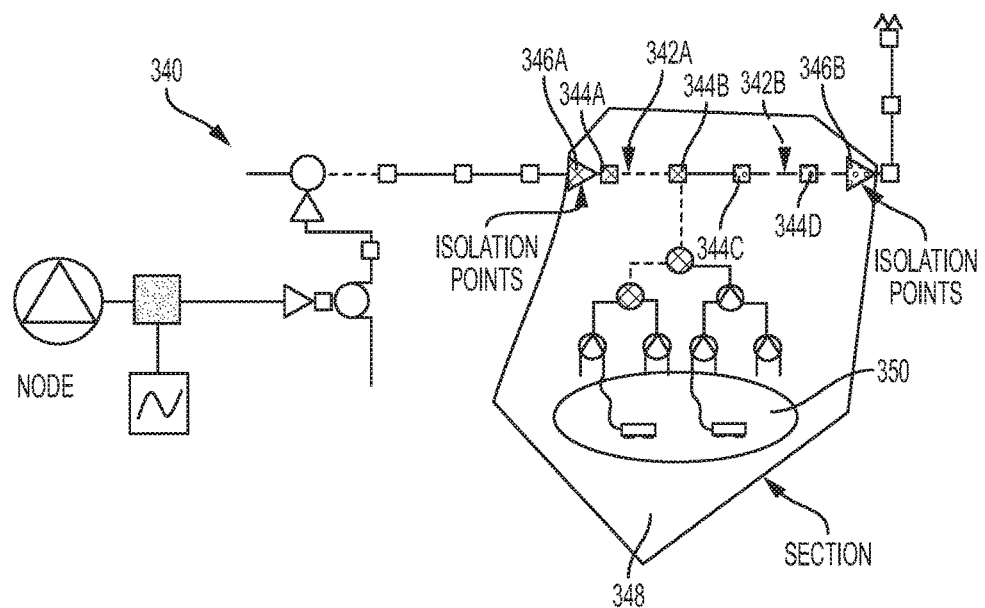
FIG. 21 is a simplified block diagram illustrating concepts of segments, sections and relevant CMs.
Figure 22:
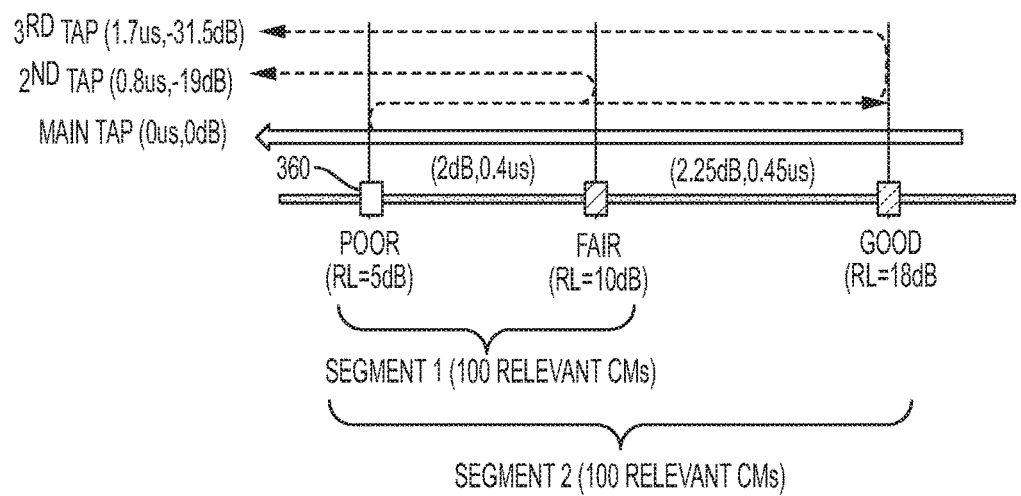
FIG. 22 is a simplified diagram illustrating yet other example details of embodiments of a communication system.

The concepts of segments, sections, and relevant CMs are further shown in FIG. 21, which illustrates an example cable network 340 comprising multiple segments, such as segments 342A, 345B, each of which is respectively terminated at each end by devices 344A, 344B, and 344C, 344D. In the illustrated embodiment, the network 340 includes two isolation points 346A, 346B; a section 348 of the network consists of the segments that are enclosed between the two isolation points 346A, 346B, including segments 344A and 344B. In HFC, an amplifier or a load (termination) acts as an isolation point. A CM is relevant to a segment, and vice versa, if at least one device in that segment is on the CM signal path. CMs 350 are relevant to segment 344A; however, they are not relevant to segment 344B.

As previously noted, according to an example PSM algorithm, detected taps are clustered in 3D (magnitude, time, phase) space. Valid taps are selected and the mean time of each cluster used to select an appropriate segment from a segment table and to tag the potential fault locations. The potential fault locations are the ones that have N affected CMs (N depends on the location of the device). Top fault locations can be identified based on the number of the affected CMs and tap magnitudes.

The PSM algorithm described herein enables group signature detection. In particular, clustering in 3D space fully utilizes all of the information contained in the taps (magnitude, timing, and phase); as a result, reliability and usability are improved. This is possible with the PSM, where the taps can be extracted from the actual channel response, and not the pre-equalization coefficients, which is the inversion of the actual channel response. Combined with the accurate tap calculations, the PSM algorithm can identify faults before they escalate and affect the network.

The PSM algorithm further enables detect fault location jointly with multiple taps. In particular, the PSM algorithm enables accurate detection of multiple adjacent taps and joint detection helps correctly locate faults. Additionally, the PSM algorithm enables multiple fault detection. IN particular, the PSM algorithm is capable of detecting multiple taps (adjacent or not) reliably and accurately and effectively detect multiple group signatures (clusters).

Turning to fault classification, two aspects may be considered: (1) fault severity; and (2) faulty device type. An example PSM algorithm outputs three variables as severity indications:
1. maximum tap magnitude: a faulty device may be tagged multiple times, and the maximum tap magnitude may be recorded and outputted for this faulty device;
2. aggregated tap magnitude: a faulty device may be tagged multiple times, and the tap magnitudes are added up and then divided by the number of CMs that generate those tagging; the quotient is outputted as the aggregated tap magnitude for the faulty device; and
3. number of affected CMs.

Figure 23:
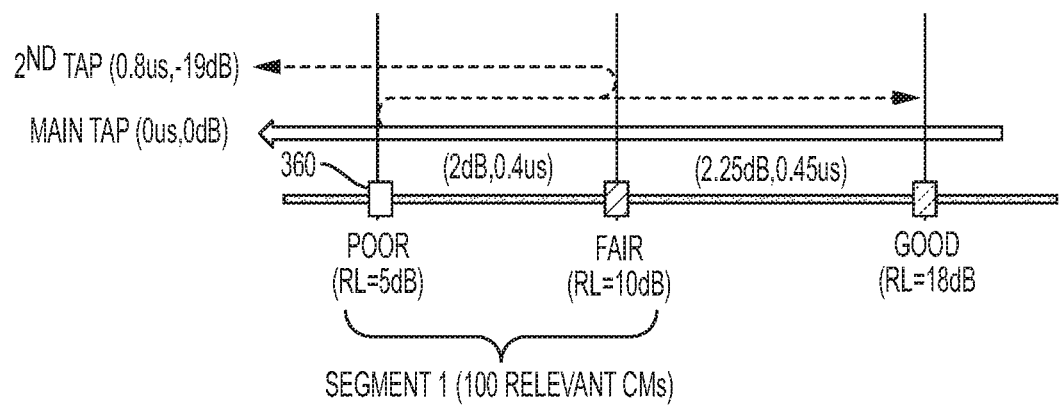
FIG. 23 is a simplified diagram illustrating a maximum tap magnitude for a device.
Figure 24:
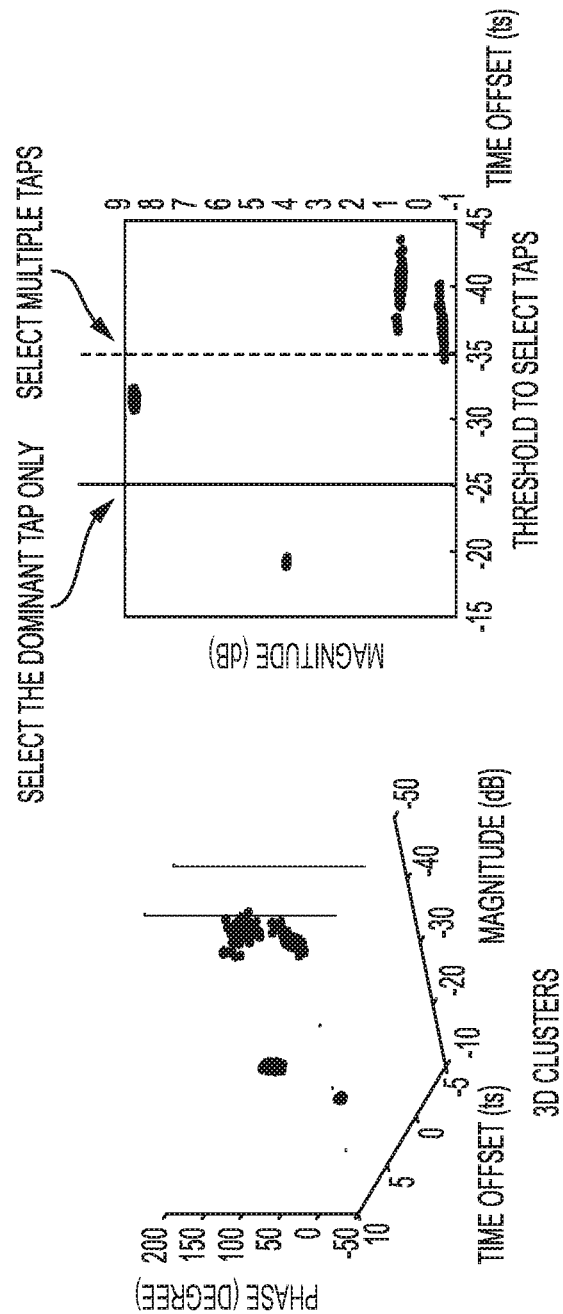
FIG. 24 is a simplified diagram illustrating maximum tap magnitude and a aggregated tap magnitude for a device.

To determine the faulty device type, various device types come from GIS database are incorporated in the segment tables. After the location of the fault device is identified, its type may be retrieved from the segment table. Consider, merely for the sake of argument and not by way of limitation, an example to illustrate fault severity as indicated in FIGS. 23 and 24. As illustrated in the FIGUREs, the aggregated tap magnitude depends on the tap selection threshold (e.g., −25 dB). The effect of the value of the tap selection threshold is illustrated by the example shown in FIG. 25. As illustrated in FIG. 23, assuming the tap selection threshold is set to −35 dB, then a maximum tap magnitude for a device 360 is −19 dB ($2^{nd}$ tap), an aggregated tap magnitude for the device 360 is −18.8 dB (0 dB+(−19 dB)+(−31.5 dB)), and the number of affected CMs is 100. As illustrated in FIG. 24, assuming the tap selection threshold is set to −25 dB, then both the maximum tap magnitude and the aggregated tap magnitude for the device 360 is −19 dB and the number of affected CMs is 100. These values, along with an indication of the device type for device 360, may be used to determine a "fault severity" for the device, which may be reported to enable corrective measures to be taken. Fault severity may be represented in any number of manners, including a number corresponding to the severity of the fault relative to other potential faults or a classification (e.g., mild, moderate, severe) indicating the relative severity of the fault. Such an indication enables an entity receiving the report to determine how quickly and at what expense the fault should be addressed.

As previously noted, faults are classified according to their severity and type. In one example, the severity is indicated with tap magnitudes (maximum and aggregated) and number of affected CMs. The device type is retrieved from the GIS segment table, for example, based on its location. The fine severity granularity of the example PSM algorithm results from at least two factors: (1) high sensitivity of the fault detection algorithm (the fault can be detected before it escalates and affects network (−25 dB taps can be detected for all the cases)); (2) number of the affected CMs.

Figure 25:
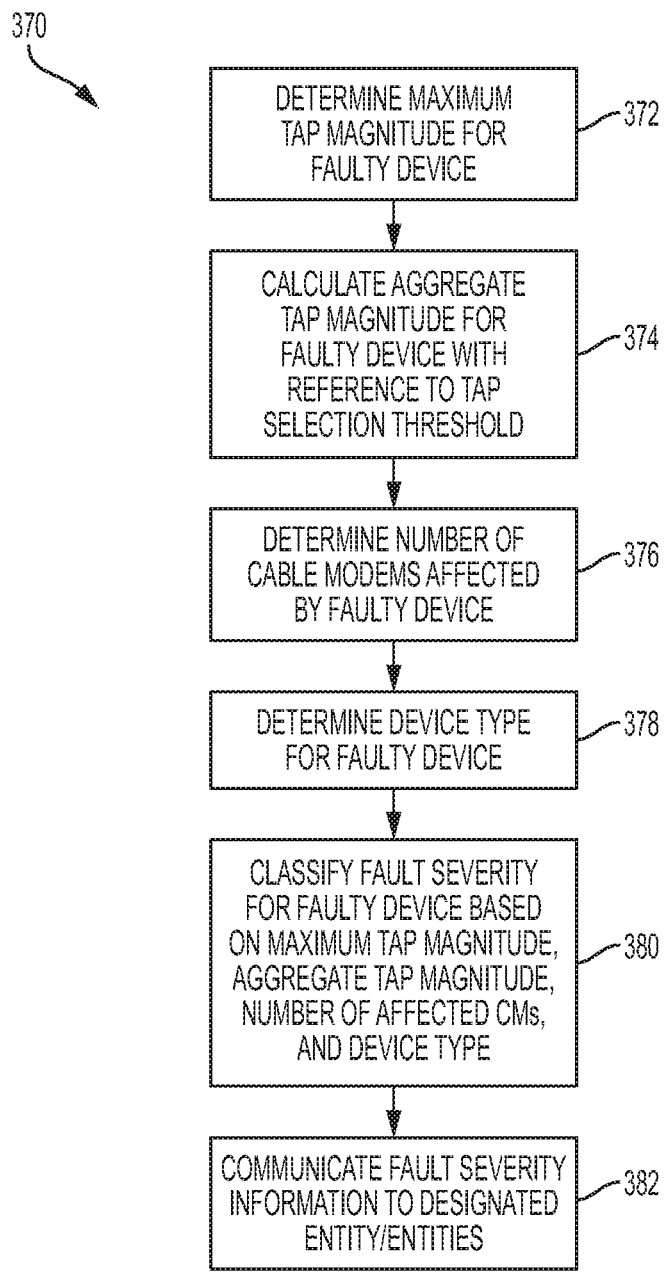
FIG. 25 is a simplified flow diagram illustrating a simplified flow diagram illustrating example operations that may be associated with a fault classification algorithm.

Turning to FIG. 25, illustrated therein is a simplified flow diagram illustrating example operations 370 that may be associated with a fault classification algorithm 58 of PSM module 24. At 372, once a faulty device has been identified and located, a maximum tap magnitude is determined for the device. At 374, an aggregated tap magnitude is calculated for the device. It will be recognized that only those tap magnitudes that exceed a tap selection threshold are used in calculating the aggregated tap magnitude. At 376, a number of CMs affected by the fault is determined. At step 378, a device type of the faulty device is determined, e.g., with reference to a segment table, such as shown in FIG. 20. At 380, the severity of the fault is classified in accordance with the values of maximum tap magnitude, aggregated tap magnitude, number of affected CMs, and device type. As previously noted, the classification may take one of any number of forms, including but not limited to a number on a numerical scale or a relative text descriptor. At 382, the fault severity information is communicated to one or more designated entities, who/which take appropriate action to repair the fault based on the information. A fault that causes −20 dB or less return loss can be considered mild. A fault that impacts a few users can be considered as mild as well. Operators may choose not to repair mild faults or delay the repairment. A fault that impacts a large group of users, say 10~20 users, will be considered as moderate or severe and needs be repaired in the earliest convenience. A fault that impacts the whole community is considered as severe and need be repaired right away.

Figure 26:
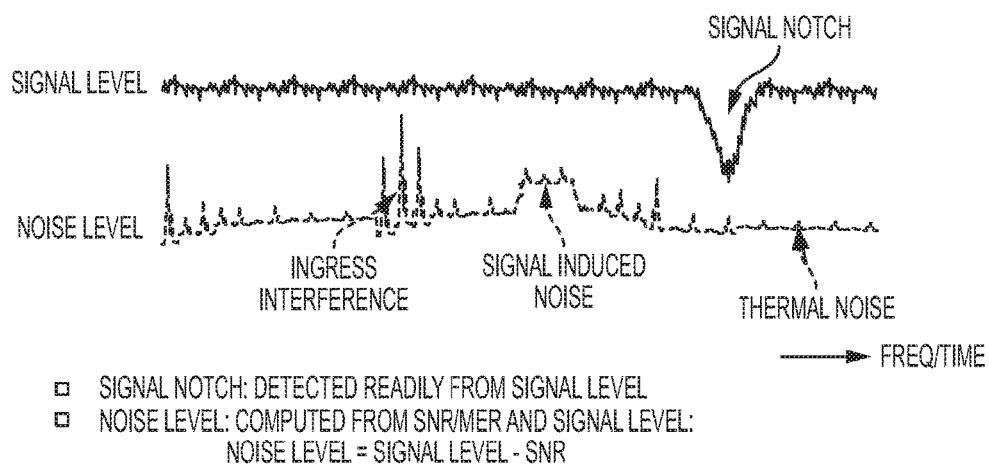
FIG. 26 is a simplified diagram illustrating a signal and noise waveform.

In some embodiments, signal and noise levels and other parameters may be used as secondary considerations in determining fault signatures and locations. An example signal and noise waveform is illustrated in FIG. 26.

Figure 27:
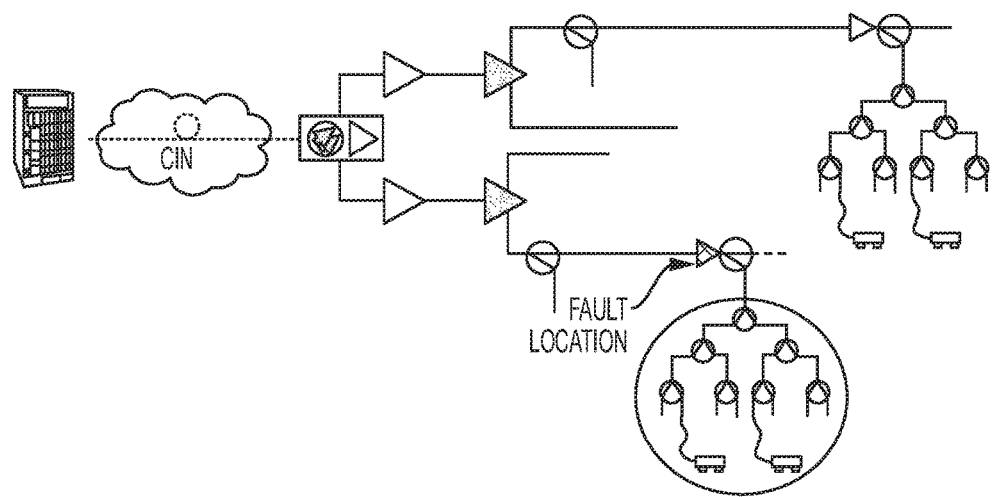
FIG. 27 is a simplified block diagram illustrating an aggregation point.

An aggregation point in the cable network is identified for all the CMs that show the same fault signature; the aggregation point indicates the fault locate on, as illustrated in FIG. 27. Once the fault signals are identified, the location of the faulty device can be sorted out by identifying the aggregation points of the CM that show the common faulty signatures. A device relevant table, as shown in FIG. 28, may be used for each device to find the number (N) of its relevant CMs that show the common faulty signatures. The faulty device is the one that has the highest N (i.e., the highest number of affected CMs). Multiple faults can be identified by selecting top N faulty devices according to the number of affected CMs.

In particular embodiments, the various components may comprise a software application executing on a specialized hardware appliance (e.g., suitably configured server) with appropriate ports, processors, memory elements, interfaces, and other electrical and electronic components that facilitate the functions described herein. In some embodiments, the various components may execute on separate hardware devices and/or comprise software applications or combination thereof that perform the operations described herein.

Note that although the operations and systems are described herein with respect to a cable network architecture, the operations and systems may be used with any appropriate related network function, including load-balancers, firewalls, WAN accelerators, etc., and the appliances that are associated therewith (e.g., customer premises equipment (CPE), cable modem (CM), etc.)

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments. Furthermore, the words "optimize," "optimization," and related terms are terms of art that refer to improvements in speed and/or efficiency of a specified outcome and do not purport to indicate that a process for achieving the specified outcome has achieved, or is capable of achieving, an "optimal" or perfectly speedy/ perfectly efficient state.

In example implementations, at least some portions of the activities outlined herein may be implemented in software in, for example, PSM module 24. In some embodiments, one or more of these features may be implemented in hardware, provided external to these elements, or consolidated in any appropriate manner to achieve the intended functionality. The various components may include software (or reciprocating software) that can coordinate in order to achieve the operations as outlined herein. In still other embodiments, these elements may include any suitable algorithms, hardware, software, components, modules, interfaces, or objects that facilitate the operations thereof.

Furthermore, PSM module 24 described and shown herein (and/or their associated structures) may also include suitable interfaces for receiving, transmitting, and/or otherwise communicating data or information in a network environment. Additionally, some of the processors and memory elements associated with the various nodes may be removed, or otherwise consolidated such that a single processor and a single memory element are responsible for certain activities. In a general sense, the arrangements depicted in the FIGURES may be more logical in their representations, whereas a physical architecture may include various permutations, combinations, and/or hybrids of these elements. It is imperative to note that countless possible design configurations can be used to achieve the operational objectives outlined here. Accordingly, the associated infrastructure has a myriad of substitute arrangements, design choices, device possibilities, hardware configurations, software implementations, equipment options, etc.

In some of example embodiments, one or more memory elements (e.g., memory element 49) can store data used for the operations described herein. This includes the memory element being able to store instructions (e.g., software, logic, code, etc.) in non-transitory media, such that the instructions are executed to carry out the activities described in this Specification. A processor can execute any type of instructions associated with the data to achieve the operations detailed herein in this Specification. In one example, processors (e.g., processor 48) could transform an element or an article (e.g., data, or electrical signals) from one state or thing to another state or thing. In another example, the activities outlined herein may be implemented with fixed logic or programmable logic (e.g., software/computer instructions executed by a processor) and the elements identified herein could be some type of a programmable processor, programmable digital logic (e.g., a field programmable gate array (FPGA), an erasable programmable read only memory (EPROM), an electrically erasable programmable read only memory (EEPROM)), an ASIC that includes digital logic, software, code, electronic instructions, flash memory, optical disks, CD-ROMs, DVD ROMs, magnetic or optical cards, other types of machine-readable mediums suitable for storing electronic instructions, or any suitable combination thereof.

These devices may further keep information in any suitable type of non-transitory storage medium (e.g., random access memory (RAM), read only memory (ROM), field programmable gate array (FPGA), erasable programmable read only memory (EPROM), electrically erasable programmable ROM (EEPROM), etc.), software, hardware, or in any other suitable component, device, element, or object where appropriate and based on particular needs. The information being tracked, sent, received, or stored in communication system 10 could be provided in any database, register, table, cache, queue, control list, or storage structure, based on particular needs and implementations, all of which could be referenced in any suitable timeframe. Any of the memory items discussed herein should be construed as being encompassed within the broad term "memory element." Similarly, any of the potential processing elements, modules, and machines described in this Specification should be construed as being encompassed within the broad term "processor."

It is also important to note that the operations and steps described with reference to the preceding FIGURES illustrate only some of the possible scenarios that may be executed by, or within, the system. Some of these operations may be deleted or removed where appropriate, or these steps may be modified or changed considerably without departing from the scope of the discussed concepts. In addition, the timing of these operations may be altered considerably and still achieve the results taught in this disclosure. The preceding operational flows have been offered for purposes of example and discussion. Substantial flexibility is provided by the system in that any suitable arrangements, chronologies, configurations, and timing mechanisms may be provided without departing from the teachings of the discussed concepts.

Although the present disclosure has been described in detail with reference to particular arrangements and configurations, these example configurations and arrangements may be changed significantly without departing from the scope of the present disclosure. For example, although the present disclosure has been described with reference to particular communication exchanges involving certain network access and protocols, communication system 10 may be applicable to other exchanges or routing protocols. Moreover, although communication system 10 has been illustrated with reference to particular elements and operations that facilitate the communication process, these elements, and operations may be replaced by any suitable architecture or process that achieves the intended functionality of communication system 10.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 as it exists on the date of the filing hereof unless the words "means for" or "step for" are specifically used in the particular claims; and (b) does not intend, by any statement in the specification, to limit this disclosure in any way that is not otherwise reflected in the appended claims.

What is claimed is:

1. A system, comprising:
   a data collector located in a cable network, wherein the data collector captures multitoned signals traversing the cable network;
   a data repository located in a cloud network and having an interface for communicating with the data collector, wherein the data repository stores the multi-tone signals captured by the data collector and network data associated with the cable network; and
   a central server comprising:
      a memory element; and
      a processor, wherein the processor and the memory element cooperate, such that the central server is configured for:
         identifying and locating a faulty device in the cable network;
         determining a maximum tap magnitude for the faulty device;
         calculating an aggregated tap magnitude for the faulty device with reference to a tap selection threshold; and
         classifying a severity of a fault at the faulty device based at least in part on the maximum tap magnitude and the aggregated tap magnitude.

2. The system of claim 1, wherein the central server is further configured for determining a number of cable modems affected by the fault and wherein the classifying the severity of the fault is based at least in part on the determined number of cable modems.

3. The system of claim 2, wherein the determining the number of cable modems affected by the fault comprises searching a segment table comprising data regarding each of a plurality of segments comprising the cable network.

4. The system of claim 1, wherein the determining the type of device associated with the fault comprises searching a segment table comprising data regarding each of a plurality of segments comprising the cable network.

5. The system of claim 1, wherein the central server is further configured for communicating fault severity information to a designated entity.

6. A method executed at an integrated circuit, the method comprising:
   identifying a faulty device in a cable network;
   locating the faulty device in the cable network;
   determining a maximum tap magnitude for the faulty device;
   calculating an aggregated tap magnitude for the faulty device with reference to a tap selection threshold; and
   classifying a severity of a fault at the faulty device based at least in part on the maximum tap magnitude and the aggregated tap magnitude.

7. The method of claim 6 further comprising determining a number of cable modems affected by the fault and wherein the classifying the severity of the fault is based at least in part on the determined number of cable modems.

8. The method of claim 7, wherein the determining the number of cable modems affected by the fault comprises searching a segment table comprising data regarding each of a plurality of segments comprising the cable network.

9. The method of claim 6, wherein the determining the type of device associated with the fault comprises searching a segment table comprising data regarding each of a plurality of segments comprising the cable network.

10. The method of claim 6 further comprising communicating fault severity information to a designated entity.

11. Non-transitory tangible computer-readable media that includes instructions for execution, which when executed by an integrated circuit, is operable to perform operations comprising:
    identifying a faulty device in a cable network;
    locating the faulty device in the cable network;
    determining a maximum tap magnitude for the faulty device;
    calculating an aggregated tap magnitude for the faulty device with reference to a tap selection threshold; and
    classifying a severity of a fault at the faulty device based at least in part on the maximum tap magnitude and the aggregated tap magnitude.

12. The non-transitory tangible computer-readable media of claim 11, wherein the operations further comprise determining a number of cable modems affected by the fault and wherein the classifying the severity of the fault is based at least in part on the determined number of cable modems.

13. The non-transitory tangible computer-readable media of claim 12, wherein the determining the number of cable modems affected by the fault comprises searching a segment table comprising data regarding each of a plurality of segments comprising the cable network.

14. The non-transitory tangible computer-readable media of claim 12, wherein the operations further comprise communicating fault severity information to a designated entity.

15. The non-transitory tangible computer-readable media of claim 11, wherein the determining the type of device associated with the fault comprises searching a segment table comprising data regarding each of a plurality of segments comprising the cable network.

* * * * *